(12) United States Patent
Komposch et al.

(10) Patent No.: US 11,581,859 B2
(45) Date of Patent: Feb. 14, 2023

(54) RADIO FREQUENCY (RF) TRANSISTOR AMPLIFIER PACKAGES WITH IMPROVED ISOLATION AND LEAD CONFIGURATIONS

(71) Applicant: Cree, Inc., Durham, NC (US)

(72) Inventors: Alexander Komposch, Morgan Hill, CA (US); Qianli Mu, San Jose, CA (US); Kun Wang, Sunnyvale, CA (US); Eng Wah Woo, Ipoh (MY)

(73) Assignee: WOLFSPEED, INC., Durham, NC (US)

( * ) Notice: Subject to any disclaimer, the term of this patent is extended or adjusted under 35 U.S.C. 154(b) by 63 days.

(21) Appl. No.: 16/913,783

(22) Filed: Jun. 26, 2020

(65) Prior Publication Data

US 2021/0408979 A1 Dec. 30, 2021

(51) Int. Cl.
| H03F 3/187 | (2006.01) |
| H03F 3/195 | (2006.01) |
| H03F 1/56 | (2006.01) |
| H03F 3/24 | (2006.01) |

(52) U.S. Cl.
CPC ............ *H03F 3/195* (2013.01); *H03F 1/565* (2013.01); *H03F 3/245* (2013.01); *H03F 2200/387* (2013.01); *H03F 2200/451* (2013.01)

(58) Field of Classification Search
CPC ..................................................... H03F 3/187
USPC ..................................... 330/307, 124 R, 295
See application file for complete search history.

(56) References Cited

U.S. PATENT DOCUMENTS

| 2,817,818 | A | * | 12/1957 | Patton | ...................... H03F 3/40 332/175 |
| 3,430,054 | A | * | 2/1969 | Erwin | ..................... G01R 15/22 250/552 |
| 3,475,759 | A | * | 10/1969 | Winegard | ................. H01Q 5/49 343/882 |
| 3,625,636 | A | * | 12/1971 | Nelson | ...................... G05D 9/12 417/326 |
| 3,952,837 | A | * | 4/1976 | Rice | ........................ B66B 1/462 187/380 |
| 4,946,547 | A | | 8/1990 | Palmour et al. | |
| 5,192,987 | A | | 3/1993 | Khan et al. | |
| 5,200,022 | A | | 4/1993 | Kong et al. | |
| 5,210,051 | A | | 5/1993 | Carter, Jr. | |
| 5,296,395 | A | | 3/1994 | Khan et al. | |

(Continued)

FOREIGN PATENT DOCUMENTS

CN 207021260 U 2/2018

OTHER PUBLICATIONS

Notification of Transmittal of the International Search Report and the Written Opinion of the International Searching Authority, or the Declaration, in corresponding PCT Application No. PCT/US2021/037978 (19 pages) (dated Nov. 23, 2021).

*Primary Examiner* — Henry Choe
(74) *Attorney, Agent, or Firm* — Myers Bigel, P.A.

(57) ABSTRACT

A radio frequency (RF) transistor amplifier package includes a submount, and first and second leads extending from a first side of the submount. The first and second leads are configured to provide RF signal connections to one or more transistor dies on a surface of the submount. At least one rivet is attached to the surface of the submount between the first and second leads on the first side. One or more corners of the first side of the submount may be free of rivets. Related devices and associated RF leads and non-RF leads are also discussed.

41 Claims, 18 Drawing Sheets

(56) References Cited

U.S. PATENT DOCUMENTS

| | | | |
|---|---|---|---|
| RE34,861 E | | 2/1995 | Davis et al. |
| 5,393,993 A | | 2/1995 | Edmond et al. |
| 5,523,589 A | | 6/1996 | Edmond et al. |
| 5,663,597 A | | 9/1997 | Nelson et al. |
| 6,218,680 B1 | | 4/2001 | Carter, Jr. et al. |
| 6,316,793 B1 | | 11/2001 | Sheppard et al. |
| 6,548,333 B2 | | 4/2003 | Smith |
| 7,030,428 B2 | | 4/2006 | Saxler |
| 7,045,404 B2 | | 5/2006 | Sheppard et al. |
| 7,544,963 B2 | | 6/2009 | Saxler |
| 7,548,112 B2 | | 6/2009 | Sheppard |
| 7,557,431 B2 | * | 7/2009 | Shaikh ............... H01L 23/66 257/659 |
| 7,592,211 B2 | | 9/2009 | Sheppard et al. |
| 7,615,774 B2 | | 11/2009 | Saxler |
| 7,709,269 B2 | | 5/2010 | Smith et al. |
| 8,049,252 B2 | | 11/2011 | Smith et al. |
| 8,120,064 B2 | | 2/2012 | Parikh et al. |
| 10,083,899 B2 | * | 9/2018 | Bajuri ............... H01L 21/4853 |
| 2014/0167858 A1 | | 6/2014 | Van Zuijlen et al. |
| 2015/0170986 A1 | | 6/2015 | Szymanowski et al. |
| 2018/0211907 A1 | | 7/2018 | Bajuri et al. |

\* cited by examiner

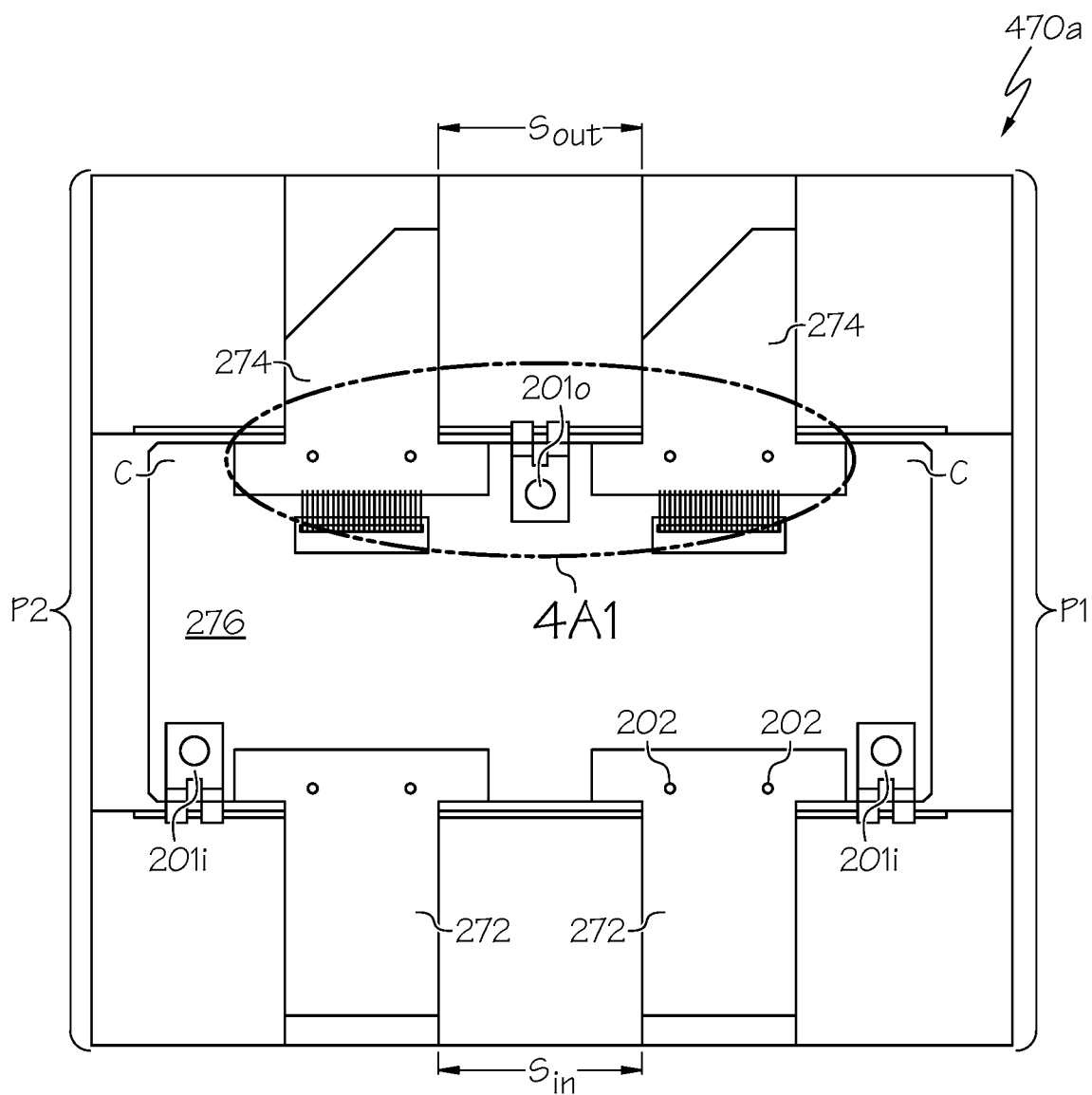
FIG. 4A
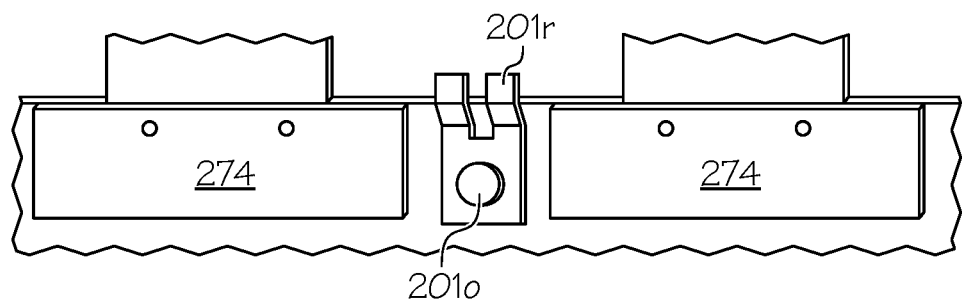
FIG. 4A1

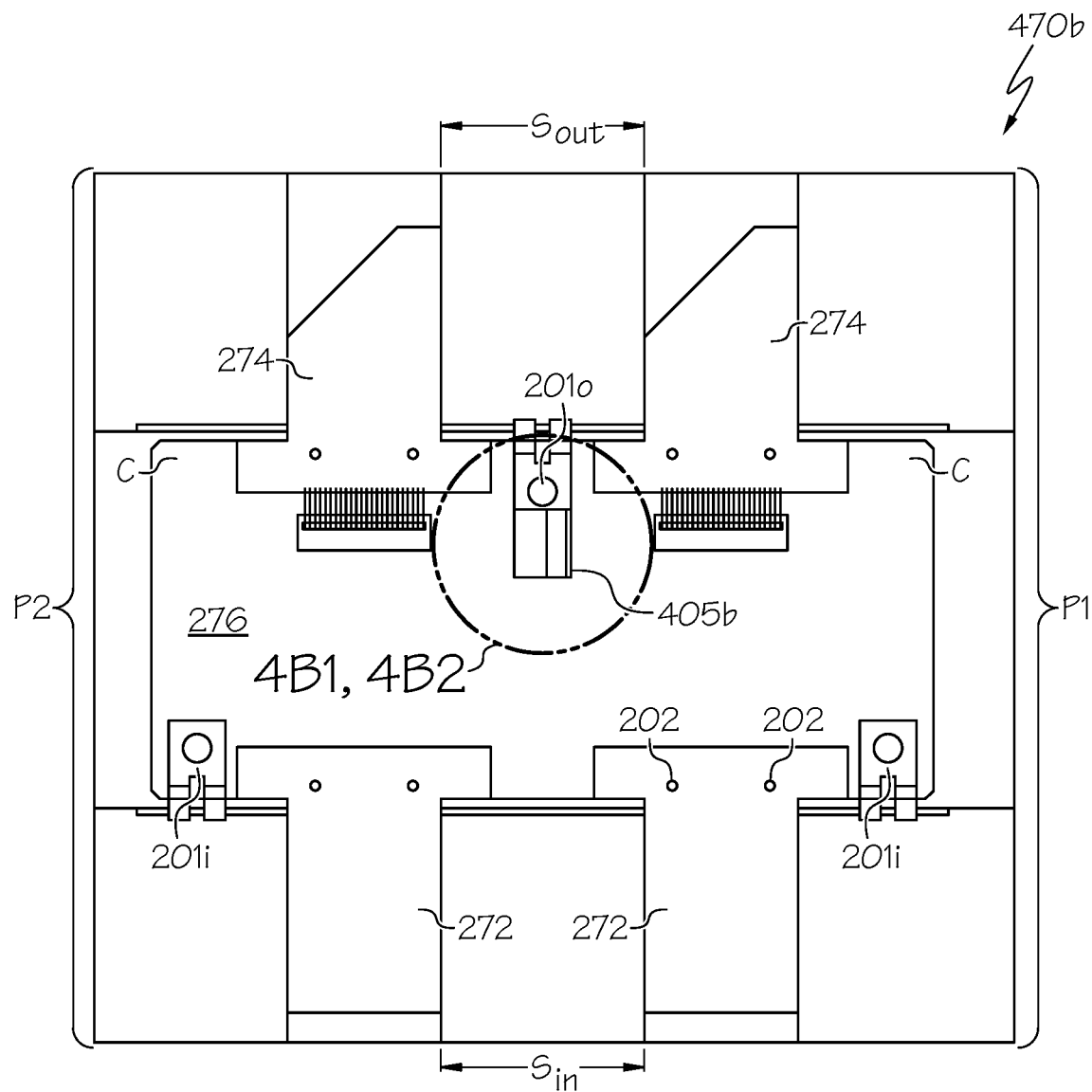
FIG. 4B
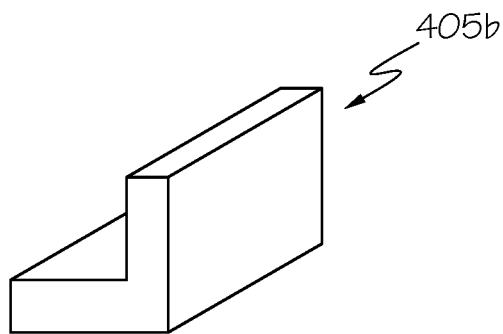
FIG. 4B1
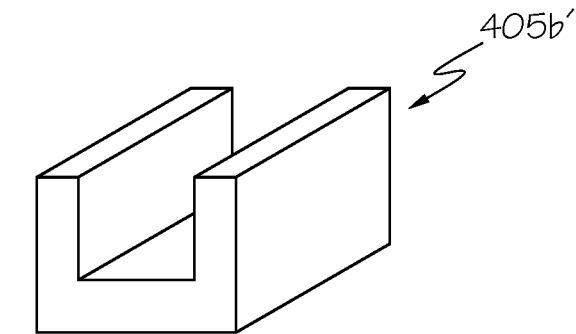
FIG. 4B2

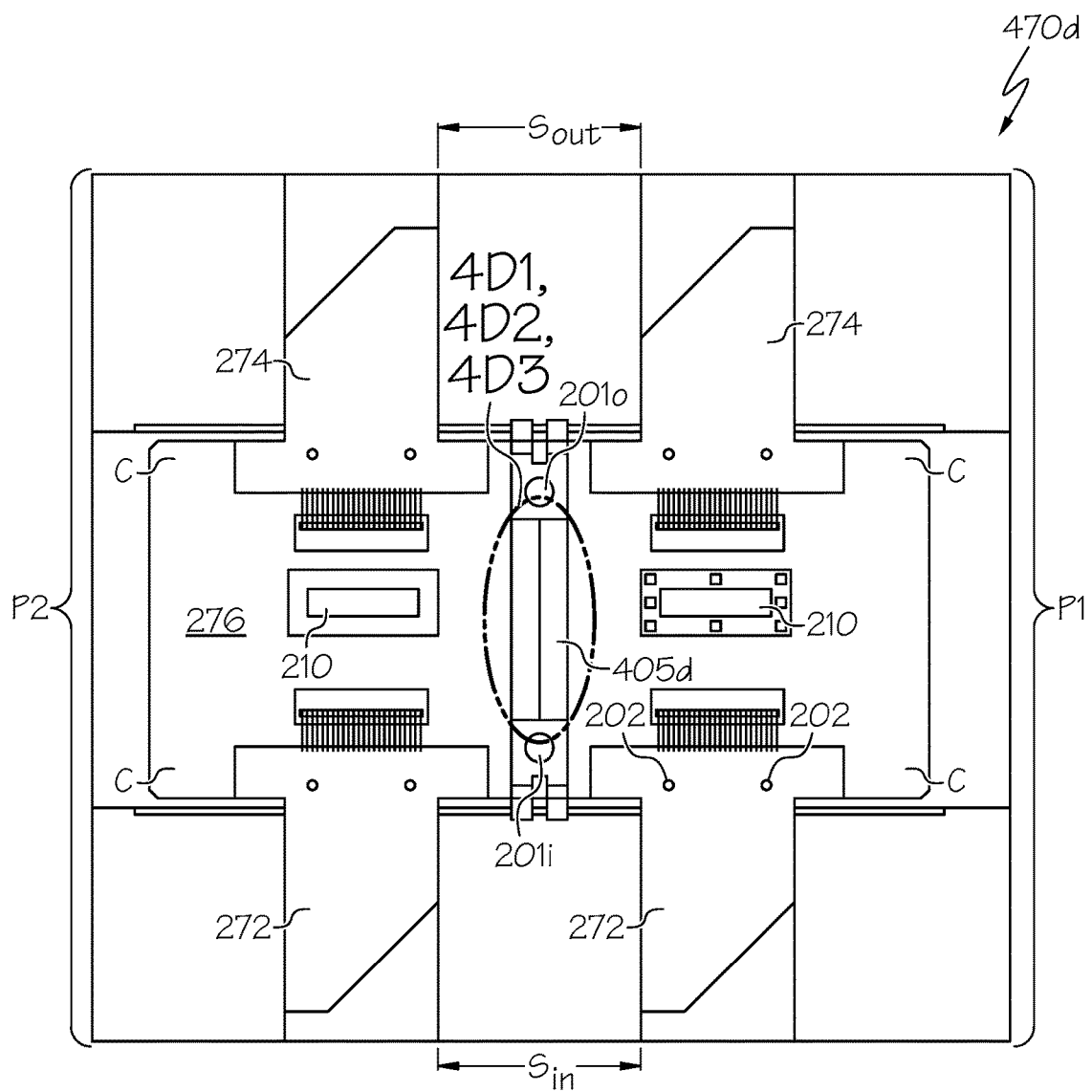
FIG. 4D
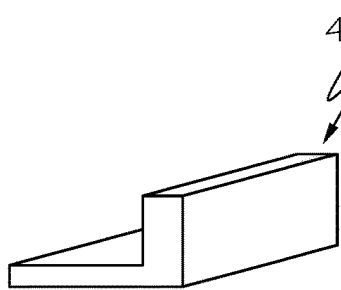
FIG. 4D1
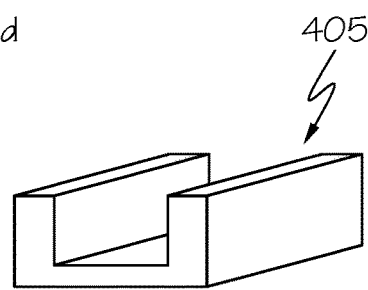
FIG. 4D2
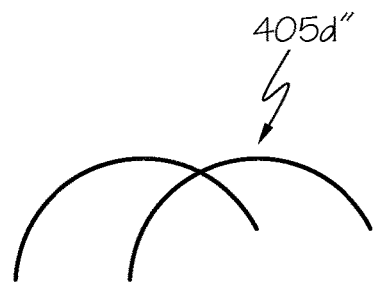
FIG. 4D3

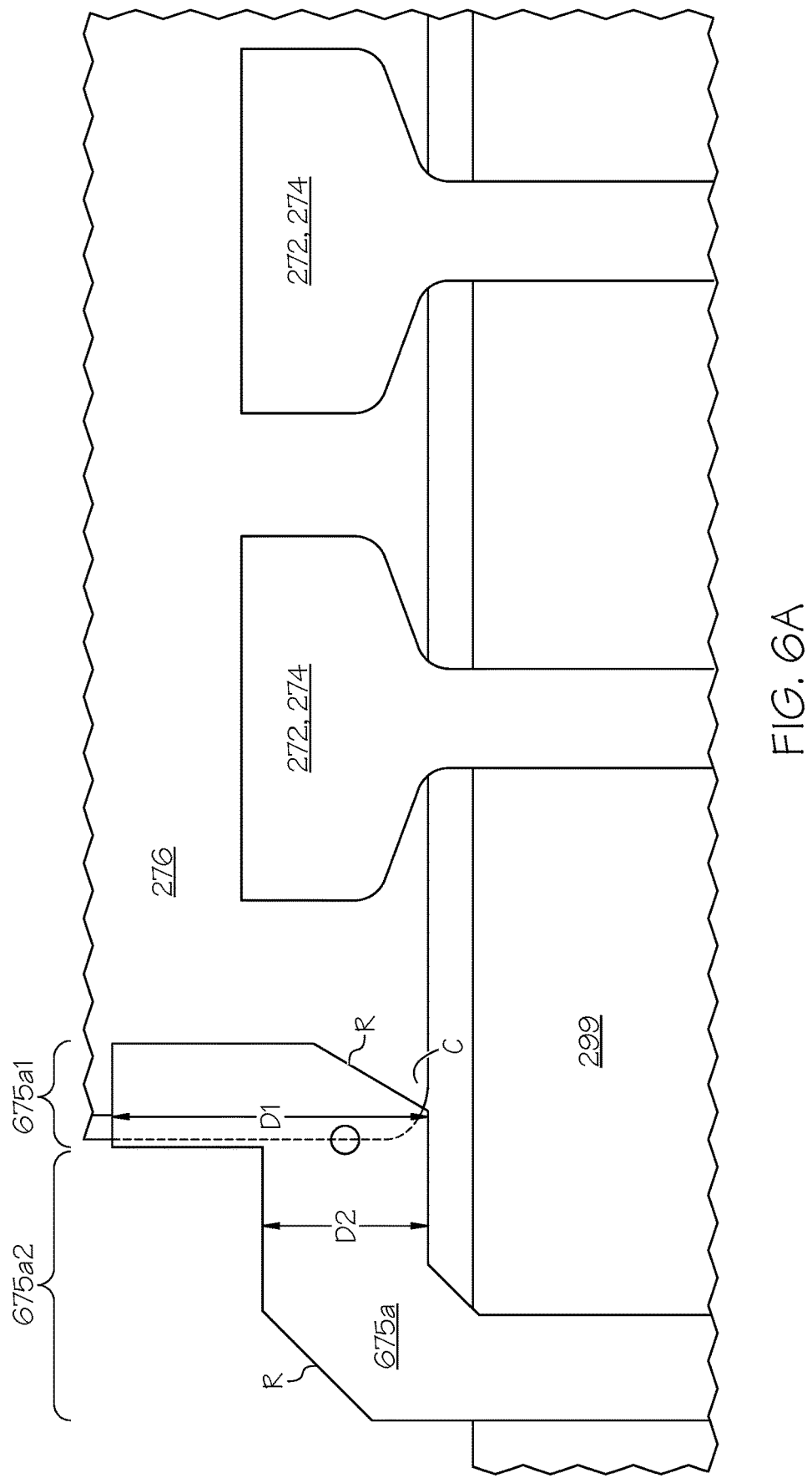

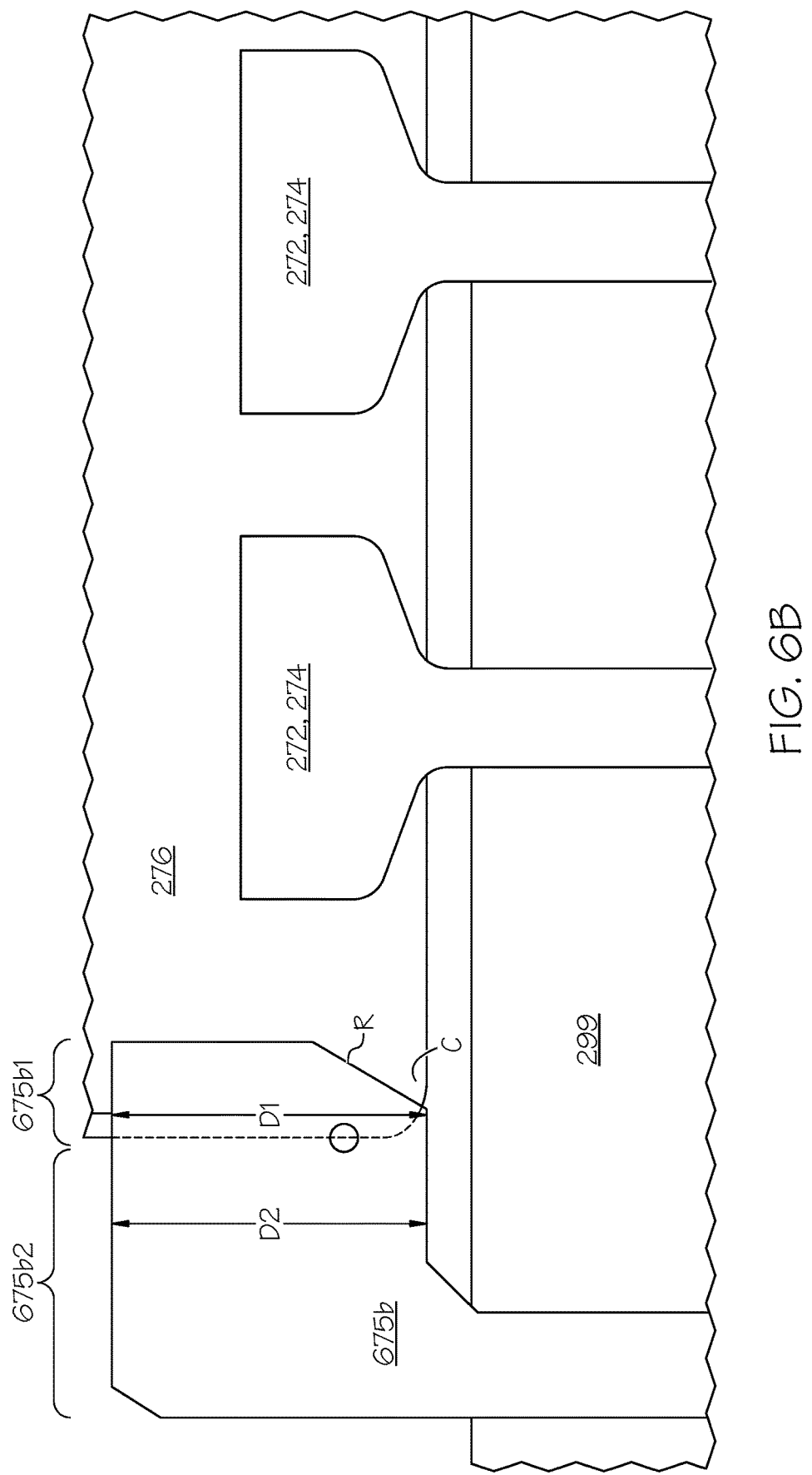

RADIO FREQUENCY (RF) TRANSISTOR AMPLIFIER PACKAGES WITH IMPROVED ISOLATION AND LEAD CONFIGURATIONS

FIELD

The present disclosure relates to microelectronic devices and, more particularly, to high power, high frequency transistor amplifiers and related device packages.

BACKGROUND

Electrical circuits requiring high power handling capability while operating at high frequencies, such as R-band (0.5-1 GHz), S-band (3 GHz) and X-band (10 GHz), have in recent years become more prevalent. In particular, there may be high demand for radio frequency (RF) transistor amplifiers that are used to amplify RF signals at radio (including microwave) frequencies. These RF transistor amplifiers may need to exhibit high reliability, good linearity and handle high output power levels.

RF transistor amplifiers may be implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented using High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. A die or chip may refer to a small block of semiconducting material or other substrate on which electronic circuit elements are fabricated. When multiple RF transistor amplifier die are used, they may be connected in series and/or in parallel.

RF transistor amplifiers often include matching circuits, such as impedance matching circuits that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonics that may be generated during device operation, such as second and third order harmonics. Termination of harmonics also influences generation of intermodulation distortion products.

The RF transistor amplifier die(s) as well as the impedance matching and/or harmonic termination circuits may be enclosed in an integrated circuit device package. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. The package typically includes an attachment surface or "flange" on which the dies are mounted, an electrically insulating encapsulant material, such as plastic or ceramic, that seals and protects the dies from moisture and dust particles. Electrically conductive leads (also referred to herein as package leads or RF leads) may extend from the package, and are used to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within the Group III nitride-based RF amplifier die(s) during operation. If the RF transistor amplifier die(s) become too hot, the performance (e.g., output power, efficiency, linearity, gain, etc.) of the RF transistor amplifier may deteriorate and/or the RF transistor amplifier die(s) may be damaged. As such, Group III nitride-based RF transistor amplifiers are typically mounted in packages that may be optimized for heat removal.

In some package designs, the flange of the package includes a thermally conductive substrate, also referred to herein as a "heat slug" or "heat sink." A package level heat slug is designed to pull heat away from the integrated circuits and toward an external heat sink. Typically, the heat slug is formed from a thermally conductive material (e.g., metal). In some package configurations, the heat slug also serves as an electrical terminal that provides a reference potential (e.g., ground) to the dies that are mounted thereon. For example, the flange may be a CPC (copper, copper-molybdenum, copper laminate structure) or copper flange that provides both an attachment surface for the dies and a heat slug.

One semiconductor package design is an "open air-cavity" or "open-cavity" package, in which a (typically ceramic) lid is placed over a metal heat slug. The ceramic lid seals an open-air cavity that includes the RF transistor amplifier dies and/or other integrated circuits and associated electrical connections. The package leads of the open air-cavity ceramic package may be attached to the heat slug using a high temperature brazing process.

Another semiconductor package design is a molded design (or "overmold" package), in which a plastic or other non-conductive material is molded (e.g., by injection or transfer molding) directly on to the heat slug to form a solid structure that directly contacts and encapsulates the RF transistor amplifier dies and/or other integrated circuits and associated electrical connections as well as the heat slug. The package leads of a molded plastic package may be attached to the heat slug using a lead frame, in which an outer frame that includes the package leads is placed around the heat slug. Metal rivets may be used to secure the outer frame of the lead frame to the heat slug. After die attach and wire bonding, the plastic encapsulant material is molded around the heat slug and the package leads. The package leads may include "mold-lock" apertures, into which the plastic encapsulant material may flow or otherwise extend to form mold lock features (or "mold locks") that further secure the package leads to the flange. Subsequently, the attachments between the package leads and the outer frame are trimmed. Although molded plastic designs may be less expensive in comparison to open-cavity designs, the rivets used in molded plastic designs may represent a substantial contributor to the overall packaging cost. Moreover, the rivets used in molded plastic designs may occupy a significant amount of area on the flange and may detrimentally impact space efficiency.

SUMMARY

According to some embodiments, a radio frequency (RF) transistor amplifier package includes a submount, first and second leads extending from a first side of the submount and configured to provide RF signal connections to one or more transistor dies on a surface of the submount, and at least one rivet attached to the surface of the submount between the first and second leads on the first side.

In some embodiments, an isolation structure may extend from the at least one rivet on the surface of the submount. The isolation structure may be configured to reduce electromagnetic coupling between the first and second leads. For example, the isolation structure may include a conductive element vertically protruding from the at least one rivet on the surface of the submount.

In some embodiments, the RF transistor amplifier package may include a first RF amplifier path having a first input lead and a first output lead on the surface of the submount, and a second RF amplifier path having a second input lead and a second output lead on the surface of the submount adjacent the first input lead and the first output lead, respectively. The first and second leads may be the first and second input leads or the first and second output leads, respectively.

In some embodiments, a spacing separating the first and second input leads may be different than a spacing separating the first and second output leads.

In some embodiments, the first and second leads may be the first and second input leads on the first side of the submount, and the at least one rivet may include at least one first rivet. At least one second rivet may be attached to the surface of the submount between the first and second output leads on a second side of the submount opposite the first side.

In some embodiments, an isolation structure may extend between the at least one first rivet and the at least one second rivet on the surface of the submount. The isolation structure may be configured to reduce electromagnetic coupling between the first and second RF amplifier paths.

In some embodiments, the isolation structure may include a conductive element vertically protruding from the surface of the submount between the first and second RF amplifier paths and connecting the at least one first rivet to the at least one second rivet.

In some embodiments, the conductive element may include at least one metal segment and/or at least one bond wire.

In some embodiments, one or more corners of the first side of the submount may be free of rivets.

In some embodiments, the first lead and/or the second lead may extend to the one or more corners of the first side of the submount.

In some embodiments, one or more non-RF leads may extend from the one or more corners of the first side of the submount.

In some embodiments, the one or more non-RF leads may respectively include a first portion that extends on the surface of the submount, and a second portion that extends beyond the surface of the submount. In plan view, the first portion and the second portion may have at least one dimension that is substantially similar.

In some embodiments, the first and second leads may respectively include an internal portion that extends on the surface of the submount and an external portion that extends from the internal portion beyond the surface of the submount. For at least one of the first and second leads, the internal and external portions may be separated from a plane of the surface of the submount by different spacings.

In some embodiments, the first and second leads may include respective mold lock features that are configured to accept portions of an overmold member to secure internal portions of the first and second leads to the surface of the submount. The mold lock features may include elliptical shapes that are confined within a width of external portions of the first and second leads that extend beyond the surface of the submount.

According to some embodiments, a radio frequency (RF) transistor amplifier package includes a submount, and first and second leads extending from a first side of the submount. The first and second leads are configured to provide RF signal connections to one or more transistor dies on a surface of the submount. One or more corners of the first side of the submount are free of rivets.

In some embodiments, one or more non-RF leads may extend from the one or more corners of the first side of the submount.

In some embodiments, the one or more non-RF leads may include shapes, overlap with the surface of the submount, and/or spacings from the surface of the submount that are configured to reduce an equivalent transmission line impedance of the one or more non-RF leads. The one or more non-RF leads may respectively include a first portion that extends on the surface of the submount and a second portion that extends beyond the surface of the submount. In some embodiments, in plan view, the first portion and the second portion of the one or more non-RF leads may include at least one dimension that is substantially similar. In some embodiments, the first portion and the second portion of the one or more non-RF leads may be separated from a plane of the surface of the submount by different first and second spacings thereabove, respectively.

In some embodiments, the first lead and/or the second lead may extend to the one or more corners of the first side of the submount.

In some embodiments, at least one rivet may be attached to the surface of the submount between the first and second leads.

In some embodiments, an isolation structure may include a conductive element vertically protruding from the at least one rivet on the surface of the submount. The isolation structure may be configured to reduce electromagnetic coupling between the first and second leads.

In some embodiments, the RF transistor amplifier package may include a first RF amplifier path having a first input lead and a first output lead on the surface of the submount, and a second RF amplifier path having a second input lead and a second output lead on the surface of the submount adjacent the first input lead and the first output lead, respectively. The first and second leads may be the first and second input leads or the first and second output leads, respectively.

According to some embodiments, a transistor amplifier package includes a submount and at least one lead extending from a first side of the submount. The at least one lead is configured to provide a respective signal connection to at least one transistor die on a surface of the submount. The at least one lead includes a first portion that extends on the surface of the submount and a second portion that extends from the first portion beyond the surface of the submount. The first and second portions are separated from a plane of the surface of the submount by different first and second spacings thereabove, respectively.

In some embodiments, the at least one lead may be a non-radio frequency (RF) lead. In some embodiments, in plan view, the first portion and the second portion of the non-RF lead may include at least one dimension that is substantially similar.

In some embodiments, the at least one lead may be configured to provide radio frequency (RF) signal connections to the at least one transistor die.

In some embodiments, the first spacing of the first portion of the at least one lead may define an impedance of at least a portion of an input or output matching circuit for the at least one transistor die, and the second spacing of the second portion of the at least one lead may define a height corresponding to at least one external connection.

In some embodiments, the at least one lead may include first and second leads configured to provide radio frequency (RF) signal connections to the at least one transistor die. At least one rivet may be attached to the surface of the submount between the first and second leads.

In some embodiments, an isolation structure may include a conductive element vertically protruding from the at least one rivet on the surface of the submount. The isolation structure may be configured to reduce electromagnetic coupling between the first and second leads.

In some embodiments, the transistor amplifier package may include a first RF amplifier path having a first input lead and a first output lead on the surface of the submount, and a second RF amplifier path having a second input lead and a second output lead on the surface of the submount adjacent the first input lead and the first output lead, respectively. The at least one lead may include the first and second input leads or the first and second output leads, respectively. The different first and second spacings may define respective impedances comprising at least a portion of an input or output matching circuit in the first and/or second RF amplifier paths.

In some embodiments, the transistor amplifier package may further include an overmold member on the surface of the submount. The first and second portions of the at least one lead may extend within and outside the overmold member, respectively.

In some embodiments, the transistor amplifier package may further include a ceramic lid on the surface of the submount. The first and second portions of the at least one lead may extend within and outside the ceramic lid, respectively.

In some embodiments, the one or more transistor dies may include a gallium nitride-based high electron mobility transistor (HEMT).

In some embodiments, the one or more transistor dies may include a silicon-based laterally diffused metal oxide semiconductor (LDMOS) transistor.

In some embodiments, the one or more transistor dies may be configured to operate in at least a portion of one or more of the 1.7-1.9 GHz, 2.5-2.7 GHz, 3.4-4.2 GHz, or 5.1-5.8 GHz frequency bands.

In some embodiments, the one or more transistor dies may be configured to operate at frequencies above 10 GHz.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 4A, 4A1, 4B, 4B1, 4B2, 4C, 4D, 4D1, 4D2, 4D3, 4E, and 4F are plan views illustrating RF transistor amplifier packages including example configurations of rivets and isolation structures in accordance with some embodiments of the present disclosure.

FIGS. 6A and 6B are enlarged plan views of non-RF leads that may be used in RF transistor amplifier packages according to some embodiments of the present disclosure.

DETAILED DESCRIPTION OF EMBODIMENTS

Figure 1A:
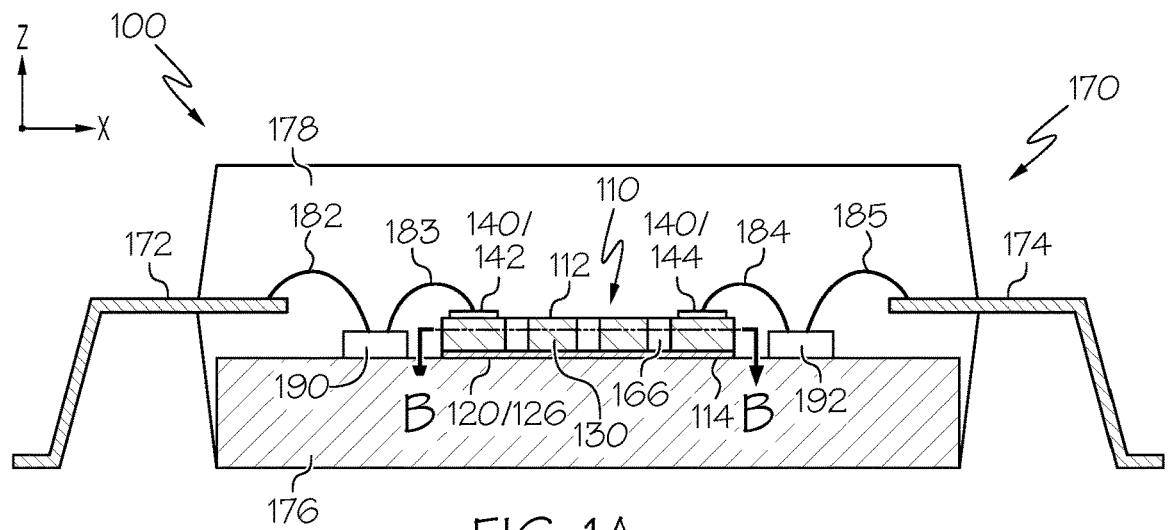
FIG. 1A is a schematic side view of a packaged Group III nitride-based RF transistor amplifier in accordance with various embodiments of the present disclosure.
Figure 1B:
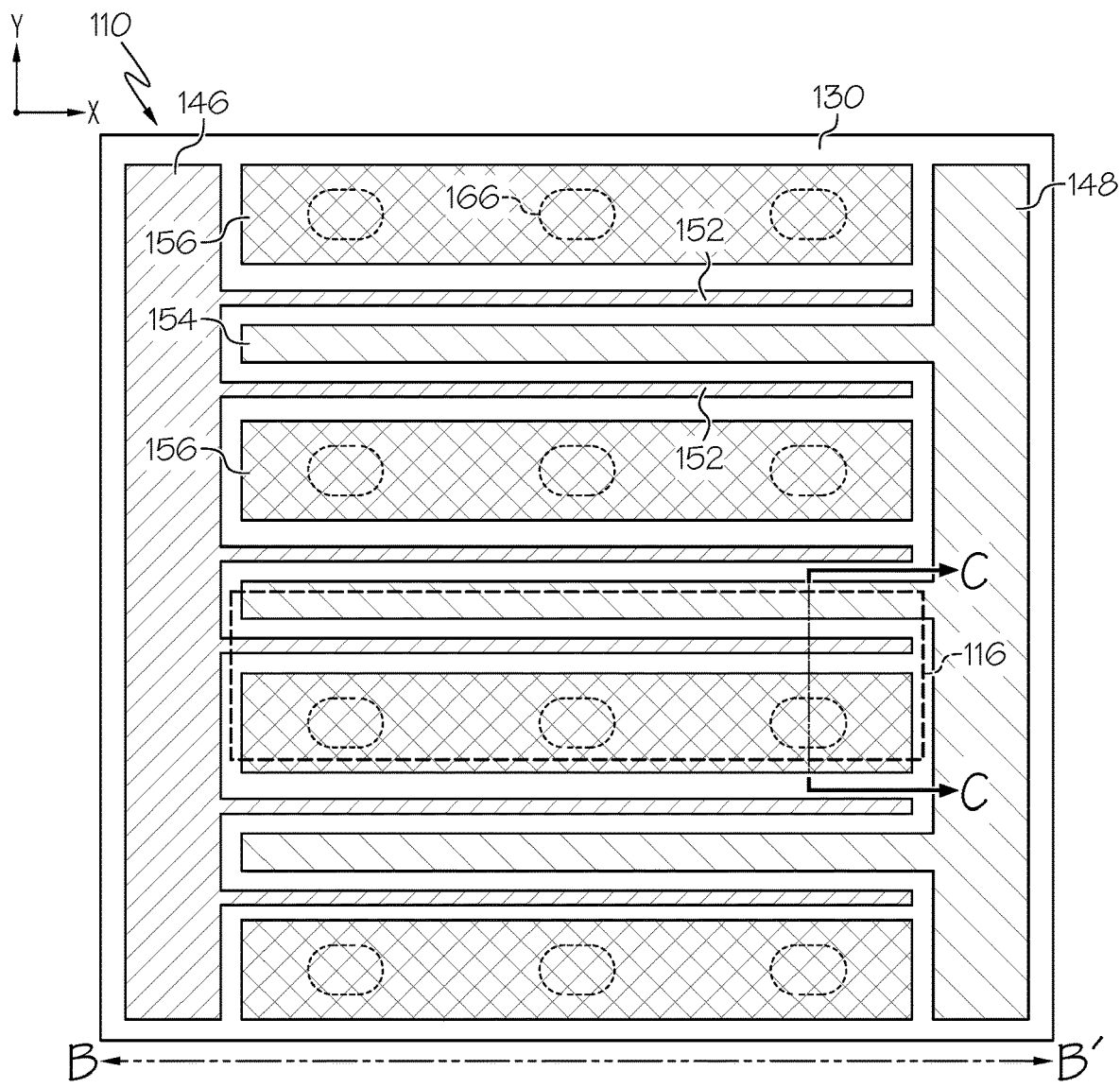
FIG. 1B is a schematic cross-sectional view of a RF transistor amplifier die in accordance with various embodiments of the present disclosure, where the cross-section is taken along line B-B' of FIG. 1A.
Figure 1C:
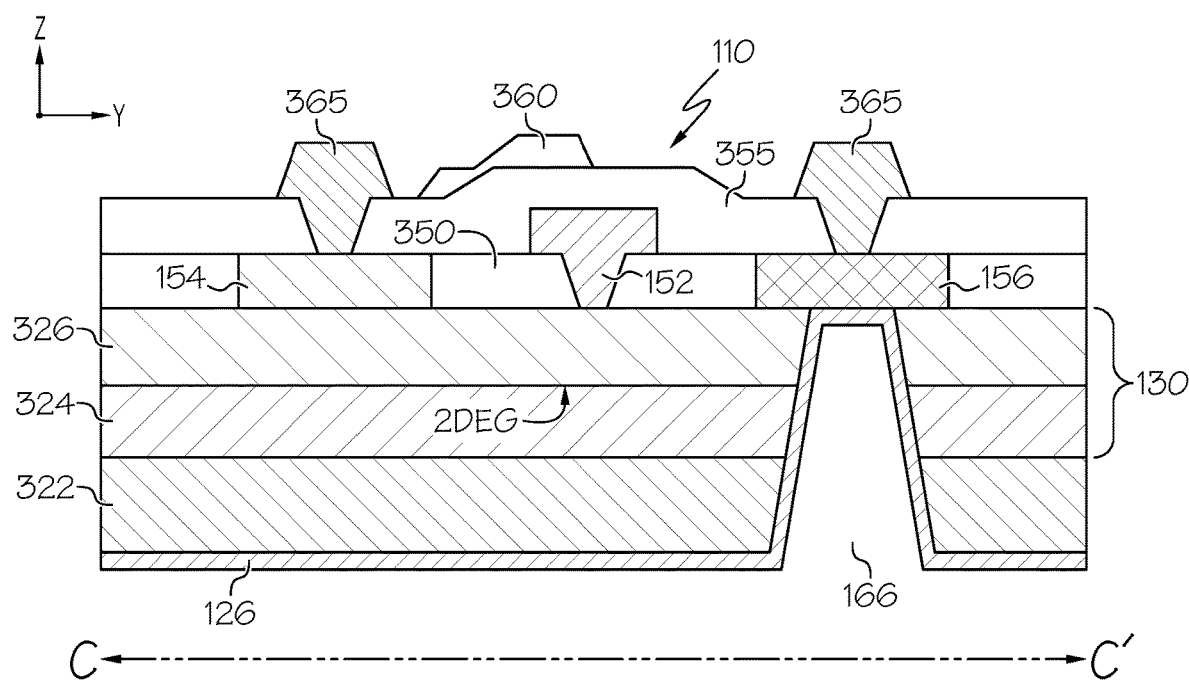
FIG. 1C is a schematic cross-sectional view of an RF transistor amplifier die unit cell in accordance with various embodiments of the present disclosure, where the cross-section is taken along line C-C' of FIG. 1B.

FIGS. 1A and 1B illustrate a packaged Group III nitride-based RF transistor amplifier. In particular, FIG. 1A is a schematic side view of a packaged Group III nitride-based RF transistor amplifier 100, and FIG. 1B is a schematic cross-sectional view of the RF transistor amplifier die 110 that is included in the packaged Group III nitride-based RF transistor amplifier 100, where the cross-section is taken along line B-B' of FIG. 1A. FIG. 1C is a schematic cross-sectional view of a unit cell 116 of the RF transistor amplifier die 110, where the cross-section is taken along line C-C' of FIG. 1B. It will be appreciated that FIGS. 1A-1C (and various of the other figures) are highly simplified diagrams and that actual RF transistor amplifiers may include many more unit cells and various circuitry and elements that are not shown in the simplified figures herein. More generally, the figures herein are intended to represent structures for identification and description and are not intended to represent the structures to physical scale.

As shown in FIG. 1A, the Group III nitride-based RF transistor amplifier 100 includes an RF transistor amplifier die 110 that is mounted within a package 170, also referred to herein as a packaged transistor device. The package 170 includes a submount (also referred to herein as a base or flange) 176 including one or more electrically conductive RF leads thereon, for example, one or more input (e.g., gate) leads 172 and one or more output (e.g., drain) leads 174. The RF transistor amplifier die 110 is mounted on the upper surface of the submount 176. The submount 176 may be or may include an electrically conductive attachment surface, for example, a metal substrate (or "slug") that acts as a thermally conductive heat sink. In some embodiments, the submount 176 may additionally or alternatively include a redistribution layer (RDL) laminate structure including conductive layers fabricated using semiconductor processing techniques; a printed circuit board with metal traces; and/or a ceramic substrate that includes electrically conductive vias and/or pads. In some embodiments, a metal lead frame may be formed and then processed to provide the metal submount 176 and/or the RF leads (e.g., gate and drain leads) 172 and 174. RF transistor amplifier 100 also includes housing 178 (e.g., a plastic overmold) that at least partially surrounds the RF transistor amplifier die 110, the RF leads 172, 174 and the metal submount 176.

The RF transistor amplifier die 110 has a top side 112 and a bottom side 114. The RF transistor amplifier die 110 includes a bottom side (also referred to as a "back" side) metallization structure 120, a semiconductor layer structure 130 and a top side metallization structure 140 that are sequentially stacked. The back side metallization structure 120 includes a metal source terminal 126. The RF transistor amplifier 100 may be a HEMT-based RF transistor amplifier, in which case the semiconductor layer structure 130 may include at least a channel layer 324 and a barrier layer 326, which are typically formed on a substrate 322 (see FIG. 1C, discussed in detail below). The substrate 322 may be a semiconductor or insulating growth substrate (such as a SiC or sapphire substrate). The growth substrate, even if formed of a non-semiconductor material, may be considered to be part of the semiconductor layer structure 130. The top side metallization structure 140 includes, among other things, a metal gate terminal 142 and a metal drain terminal 144.

Input matching circuits 190 and/or output matching circuits 192 may also be mounted within the housing 170. The matching circuits 190, 192 may be impedance matching circuits that match the impedance of the fundamental component of RF signals input to or output from the RF transistor amplifier 100 to the impedance at the input or output of the RF transistor amplifier die 110, respectively, and/or harmonic termination circuits that are configured to short to ground harmonics of the fundamental RF signal that may be present at the input or output of the RF transistor amplifier die 110, such as second order or third order harmonics. As schematically shown in FIG. 1A, the input and output matching circuits 190, 192 may be mounted on the metal flange 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires 184. The source terminal 126 of RF transistor amplifier die 110 may be mounted directly on the metal flange 176. The metal flange 176 may provide the electrical connection to the source terminal 126 and may also serve as a heat dissipation structure. The first through fourth bond wires 182-185 may form part of the input and/or output matching circuits. The gate lead 172 and the drain lead 174 may extend through the housing 178.

FIG. 1B is a schematic cross-sectional view of the RF transistor amplifier die 110 that is taken through a portion of the top side metallization structure 140. Dielectric layers that isolate the various conductive elements of the top-side metallization structure 140 from each other are not shown in FIG. 1B to simplify the drawing.

As shown in FIG. 1B, the RF transistor amplifier die 110 is illustrated by way of example as a Group III nitride-based HEMT RF transistor amplifier that has a plurality of unit cell transistors 116 that each include a gate finger 152, a drain finger 154 and a source finger 156. It will be appreciated, however, that the RF transistor amplifier dies 110 may be implemented in a different technology such as, for example, a silicon LDMOS RF transistor amplifier. The gate fingers 152 are electrically connected to a common gate bus 146, and the drain fingers 154 are electrically connected to a common drain bus 148. The gate bus 146 is electrically connected to the gate terminal 142 (e.g., through a conductive via that extends upwardly from the gate bus 146) which is implemented as a gate bond pad (see FIG. 1A), and the drain bus 148 is electrically connected to the drain terminal 144 (e.g., through a conductive via that extends upwardly from the drain bus 148) which is implemented as a drain bond pad (see FIG. 1A). The source fingers 156 are electrically connected to the source terminal 126 via a plurality of conductive source vias 166 that extend through the semiconductor layer structure 130. The conductive source vias 166 may be metal-plated vias that extend completely through the semiconductor layer structure 130.

Referring again to FIG. 1A, the metal flange 176 may act as a heat sink that dissipates heat that is generated in the RF transistor amplifier die 110. The heat is primarily generated in the upper portion of the RF transistor amplifier die 110 where relatively high current densities are generated in, for example, the channel regions of the unit cell transistors 116. This heat may be transferred though the source vias 166 and the semiconductor layer structure 130 to the metal flange 176.

Depending on the embodiment, the packaged transistor amplifier 100 can include, for example, a monolithic microwave integrated circuit (MMIC) as the RF transistor amplifier die 110 in which case the RF transistor amplifier die 110 incorporates multiple discrete devices. When the RF transistor amplifier die 110 is a MMIC implementation, the input matching circuits 190 and/or the output matching circuits 192 may be omitted (since they may instead be implemented within the RF transistor amplifier die 110) and the bond wires 182 and/or 185 may extend directly from the gate and drain leads 172, 174 to the gate and drain terminals 142, 144. In some embodiments, the packaged RF transistor amplifier 100 can include multiple RF transistor amplifier dies that are connected in series to form a multiple stage RF transistor amplifier and/or may include multiple transistor dies that are disposed in multiple amplifier paths (e.g., in parallel) to form an RF transistor amplifier with multiple RF transistor amplifier dies and multiple paths, such as in a dual-path driver amplifier and/or a Doherty amplifier configuration.

As noted above, some RF package designs may use rivets to secure RF leads to the package (for example, by riveting an electrically conductive lead material to an electrically conductive submount or flange 176) before formation of the overmold 178. The rivets may be physically connected to the RF leads by a lead frame including trim bars or tie bars, which can be removed after forming the overmold. The lead frame may be an electrically conductive structure, for example, of the same material(s) as the RF leads and/or the rivets. In particular, after populating a package with one or more active transistor dies, providing electrical connections between the dies and/or RF leads, and forming an overmold on the package, the tie bars (extending between the RF leads and the rivets) may be removed so as to electrically separate the RF leads from the flange. As such, the rivets may provide mechanical stability for the RF leads during the packaging process, and may remain on the surface of the flange after packaging is complete.

Some embodiments of the present disclosure may arise from realization that rivet designs in which the rivets are positioned at the four corners of the package, or on the two longer sides of the package, may occupy valuable internal area of the package and/or may limit design flexibility (e.g., in connecting additional, non-RF leads from the shorter side(s) or from the corners of the package). Embodiments of the present disclosure provide RF power amplifier package designs that include rivets, mold locks, and/or leads (both RF and non-RF) that are sized, positioned, shaped, or otherwise configured to improve electrical characteristics and/or performance of RF power amplifiers.

As described herein, RF leads may refer to electrical connections that provide RF signals for input to and/or output from components of the RF transistor amplifier package. For example, the RF leads may provide RF signals to one or more transistor dies for operation in at least a portion of one or more of the 1.7-1.9 GHz, 2.5-2.7 GHz, 3.4-4.2 GHz, or 5.1-5.8 GHz frequency bands, and/or at frequencies above 10 GHz. Non-RF leads may refer to electrical connections that provide non-RF signals (i.e., signals having frequencies outside the radio spectrum) for input to and/or output from components of RF transistor amplifier package. Rivets as described herein may include metal or other electrically conductive material(s), which may be the same as or different from the material(s) of the submount or flange.

Figure 2A:
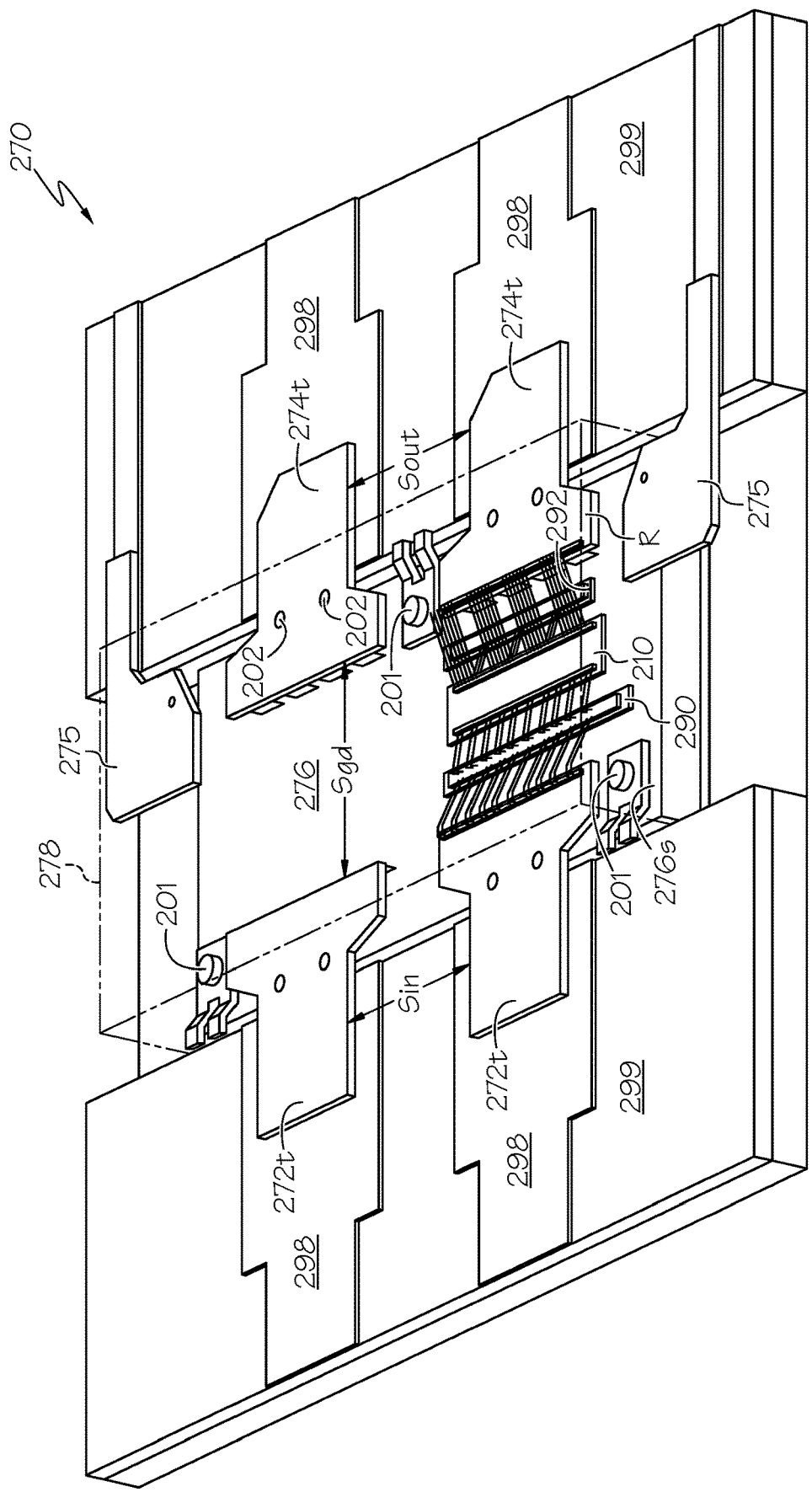
FIG. 2A is a perspective view of an RF transistor amplifier package in accordance with various embodiments of the present disclosure.
Figure 2B:
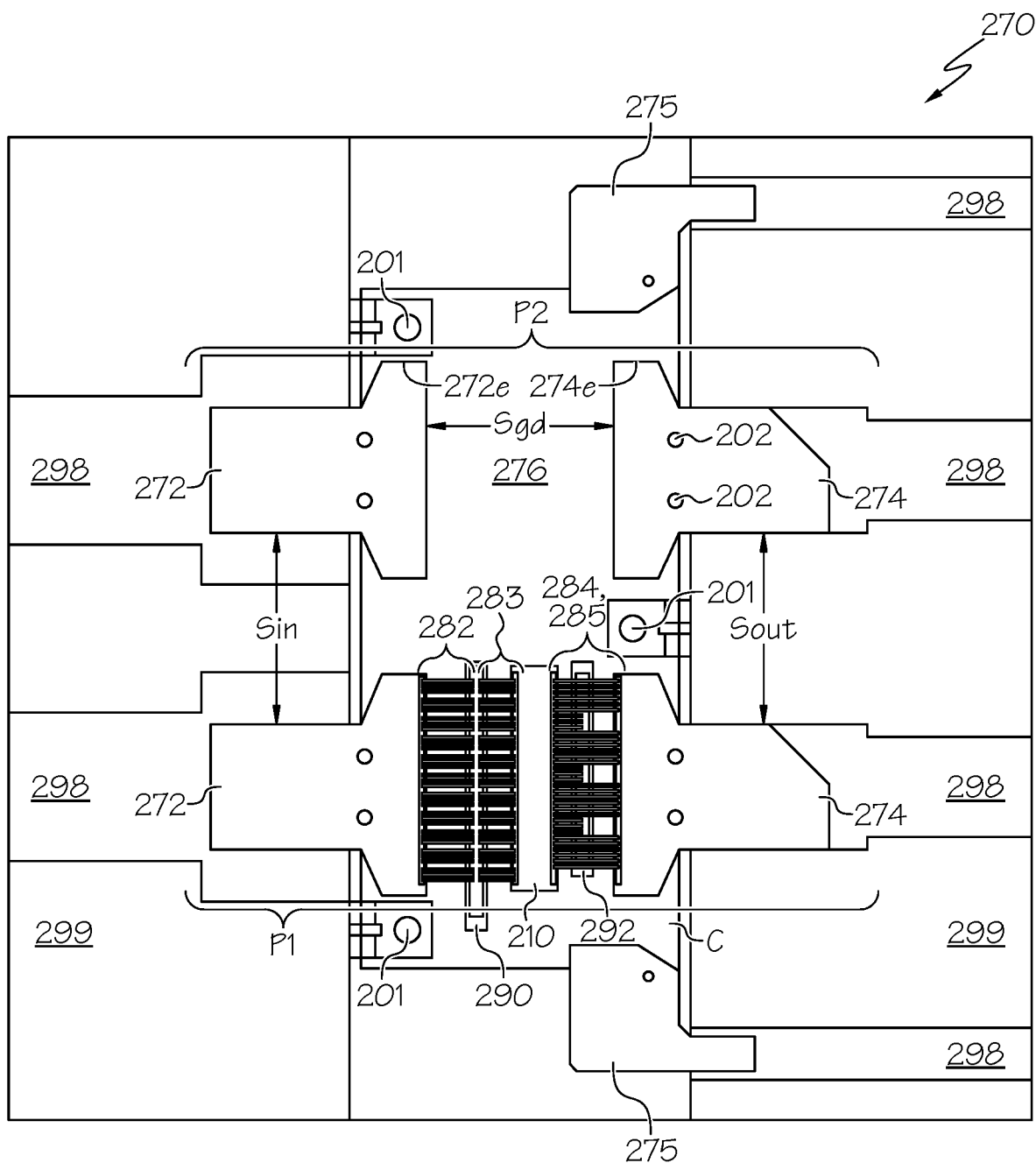
FIG. 2B is a plan view of the RF transistor amplifier package of FIG. 2A.

FIG. 2A is a perspective view of an RF transistor amplifier package 270 in accordance with various embodiments of the present disclosure. FIG. 2B is a plan view of the RF transistor amplifier package 270 of FIG. 2A, with the overmold member removed for simplification. The RF transistor amplifier package 270 and components thereof may correspond to the package 170 and components described above with reference to FIGS. 1A-1D.

As shown in FIGS. 2A and 2B, the package 270 includes a submount 276 (also referred to as a base or flange) including a surface 276s that is configured to accept one or more active transistor dies 210. The active transistor die(s) 210 are mounted on the surface 276s and coupled between electrically conductive RF input (e.g., gate) leads 272 and RF output (e.g., drain) leads 274 by bond wires 282-285 to define respective side-by-side RF signal paths P1 and P2, referred to herein as respective RF amplifier paths. The flange 276 may be an electrically conductive attachment surface, including but not limited to a conductive (e.g., metal) substrate, such as a heat slug or other heat sink. An internal area of the flange 276 may define the attachment surface 276s for the transistor dies 210, leads, 272, 274, 275, and/or other components of the package 270. The surface 276s of the flange 276 may be, but is not necessarily, generally planar. In some embodiments, the flange 276 and/or the surface 276s may be formed of one or more thermally and electrically conductive materials, such as copper, aluminum, and alloys thereof. In some embodiments, the flange 276 and/or the surface 276s may be configured to provide an electrical ground for one or more components of the package 270.

The RF transistor amplifier package 270 includes two or more electrically conductive input and output leads 272 and 274 that are configured to provide RF signal connections to (i.e., to carry RF signals to or from) the transistor die(s) 210. In the depicted example, the RF transistor amplifier package 270 includes one or more input leads 272 extending from a first side or edge of the package 270, and one or more output leads 274 extending from a second side of the package 270 in an opposite direction as the input leads 272. The number, size, and geometry of the leads 272, 274 can vary. Moreover, the RF transistor amplifier package 270 can be configured according to any of a wide variety of lead designs (e.g., bent lead, flat package, etc.). The leads 272, 274 can include one or more electrically conductive materials, such as copper, aluminum, and alloys thereof.

The RF transistor amplifier package 270 includes one or more semiconductor dies 210 mounted on the surface of the flange 276. In the depicted example, the RF transistor amplifier package 270 includes two side-by-side amplifier paths P1 and P2 with respective active transistor dies 210 in each path P1 and P2; however the semiconductor die 210 in the upper amplifier path P2 (between the upper-positioned leads 272 and 274 in FIGS. 2A and 2B) is not shown for simplification. More generally, the RF transistor amplifier package 270 can include any number of transistor dies 210 and amplifier paths P1, P2.

The semiconductor dies 210 can be configured as transistor dies, e.g., MOSFETs (metal-oxide semiconductor field-effect transistor), LDMOS (laterally-diffused metal-oxide semiconductor) devices, or HEMT (high electron mobility transistor) devices. The transistor die(s) 210 can be configured as vertical devices, with a reference terminal (e.g., a source terminal) that directly faces and electrically contacts the conductive flange 276. Alternatively, the transistor die(s) 210 can be configured as lateral devices that are configured to conduct in a lateral direction that is parallel to the surface of the flange 276. In addition, one or more passive devices 290, 292, e.g., chip capacitors, inductors, etc. may be mounted on the surface of the flange 276 between the transistor dies 210 and the input and output leads 272 and 274, e.g., as matching circuits.

Conductive electrical connections 282-285 electrically connect terminals of the semiconductor dies 210 to the input and output leads 272 and 274. In the depicted example, these electrical connections 282-285 are provided by electrically conductive bond wires. The number and configuration of the bond wires may vary. More generally, any of a variety of commonly known electrical connection techniques, such as ribbon or conductive metallization, may also be used to complete these electrical connections 282-285.

In the example of FIGS. 2A and 2B, the gate lead 272 is connected to an input matching circuit 290 by one or more first bond wires 282; the input matching circuit 290 is connected to the gate terminal of RF amplifier die 210 by one or more second bond wires 283; the drain lead 274 is connected to the drain terminal 244 of RF amplifier die 210 by one or more third bond wires 284, and an output matching circuit 292 is connected to the drain terminal 244 of the RF transistor amplifier die 210 by one or more fourth bond wires 285. The bond wires 282-285 may form part of the input and/or output matching circuits 290/292 in each amplifier path. In some embodiments, the input/output matching circuits 290/292 may be implemented by passive devices, such as integrated passive devices (IPDs). IPDs include inductors and/or other passive electrical components, and may be fabricated using standard semiconductor processing techniques such as thin film and/or photolithography processing. IPDs can be flip chip mountable or wire bondable components, and may include thin film substrates such as silicon, alumina, or glass.

Still referring to FIGS. 2A and 2B, the source terminal of RF transistor amplifier die 210 may be mounted directly on the metal flange 276, which may provide the electrical connection to the source terminal and may also serve as a heat dissipation structure. The die, matching circuits, and/or other components of the upper amplifier path P2 (between the upper-positioned leads 272 and 274 in FIGS. 2A and 2B) are not shown for simplification. An overmold member 278 (e.g., a plastic overmold) encapsulates the components of the respective amplifier paths P1, P2. The gate leads 272 and the drain leads 274 of the respective amplifier paths P1, P2 extend through the housing of the package 270 (e.g., through the overmold 278) to define external connection tabs 272t and 274t that extend outside and beyond the housing of the package 270 for connection to external device(s) (illustrated as conductive traces 298 of one or more external PCBs 299). The package 270 further includes rivets 201, mold lock features 202, and non-RF leads 275. The rivets 201, mold locks 202, RF leads 272, 274, and/or non-RF leads 275 are positioned and/or shaped (alone or in any combination) to provide desired electrical characteristics.

In particular, some embodiments of the present disclosure include package designs that position one or more of the rivets 201 between two or more of the RF leads 272, 274 on the same side or edge of the package 270 (e.g., between the input leads 272 and/or between the output leads 274 of respective amplifier paths P1, P2). In some embodiments, the rivets 201 may be configured to reduce electromagnetic coupling/increase electrical isolation between adjacent amplifier paths (e.g., between paths of a dual-path amplifier or between main and peaking amplifiers of a Doherty amplifier), for example, by increasing spacings Sin/Sout between two or more adjacent leads 272/274 and/or by providing one or more isolation structures coupled to or extending from the rivets 201. In addition, as peripheral regions (e.g., one or more corners C) of the flange 276 are free of rivets 201, the available surface area on the flange 276 may be increased, for example, to further increase the spacings between RF leads 272, 274 (e.g., by attaching the RF leads 272, 274 at the corners C of the flange 276) and/or to allow for connection and/or design flexibility of one or more additional components (e.g., for attachment of the non-RF leads 275 at the corners C of the flange 276).

In some embodiments, the size, shapes, and/or positioning of the mold locks 202 of the RF leads 272, 274 may also be configured to improve electrical characteristics. For example, the mold locks 202 may be elliptical or circular in shape in plan view, which may reduce current crowding effects in the RF leads 272, 274 in comparison to leads including elongated or slot-shaped mold locks.

In some embodiments, the RF leads 272 and/or 274 may likewise be configured to improve electrical characteristics, including but not limited to insertion loss, parasitic capacitance, current crowding, and impedance matching flexibility. For example, the RF leads 272 and/or 274 may include variation and/or optimization of the lengths of external (i.e., extending outside of the overmold 278) connection tabs 272t, 274t, the spacing Sgd between the input 272 and output 274 RF leads (e.g., gate-to-drain lead spacing to accommodate matching topologies for high frequency (e.g., 1.8 GHz) LDMOS and (e.g., 2 GHz to 5 GHz) GaN HEMT dies), vertical separation or gaps between the RF leads 272, 274 and the flange 276 (e.g., RF leads with varying lead-to-ground spacing to provide desired capacitance for impedance matching and/or to reduce mutual coupling effects between bond wires 282-285), and/or plan view shapes of the leads 272 and/or 274 (e.g., with rounded edges 272e, 274e to reduce current crowding and/or optimize field distribution).

In some embodiments, the non-RF leads 275 may also be configured to improve electrical characteristics. For example, due to internal positioning of one or more rivets 201, the shape of the non-RF leads may be configured to reduce parasitic inductance and/or extend the resonance frequency to increase or maximize video band bandwidth. In some embodiments, the non-RF leads 275 may be designed or otherwise configured (e.g., with respect to lead shape, overlap with the submount, and/or spacing from the submount) to reduce the equivalent transmission line impedance, and may be used in combination with additional capacitance (e.g., as provided by one or more IPDs) to extend the baseband bandwidth or otherwise provide baseband design flexibility.

Figure 3A:
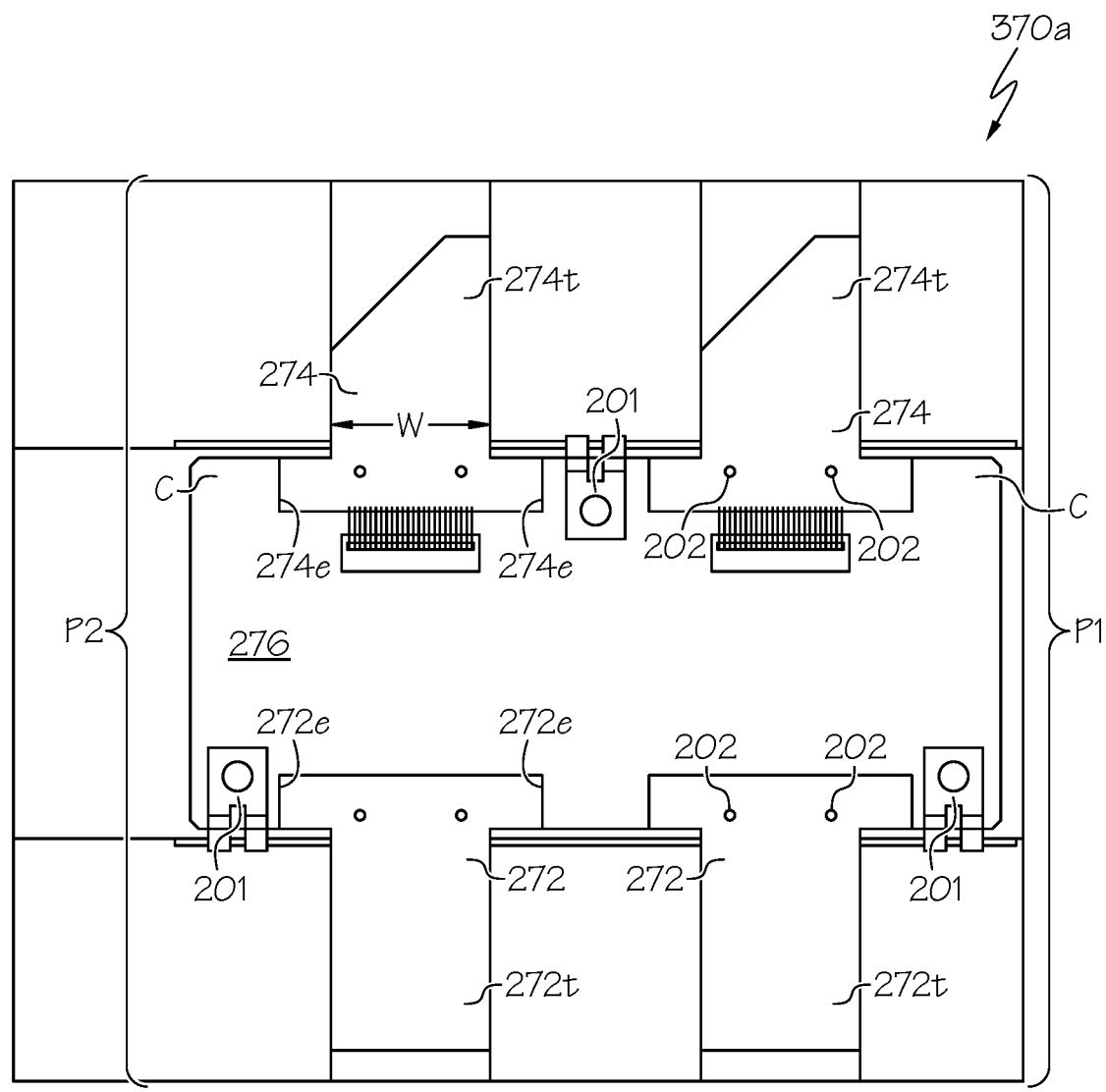
FIGS. 3A and 3B are plan views illustrating RF transistor amplifier packages including example mold lock structures in accordance with some embodiments of the present disclosure.
Figure 3B:
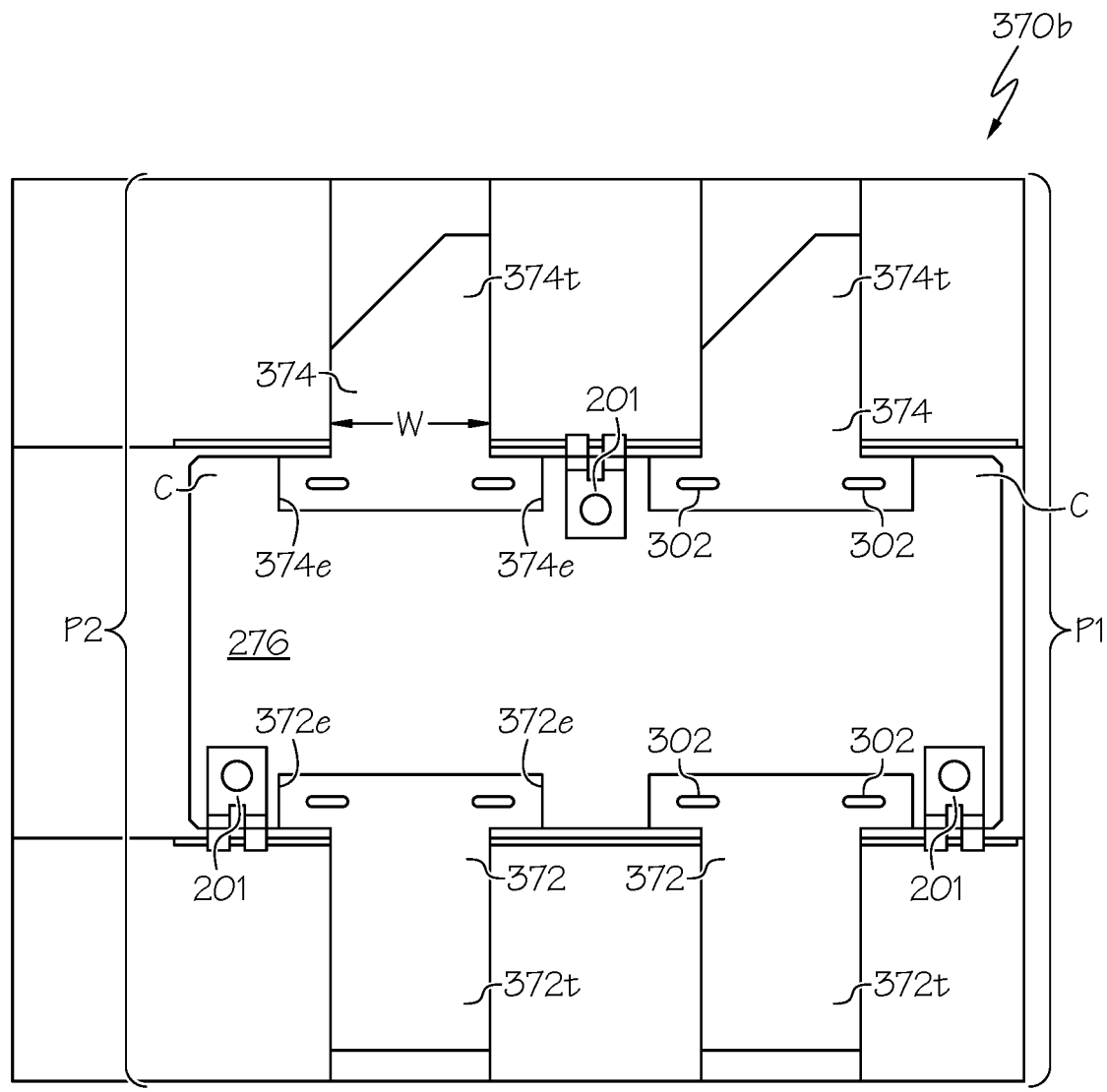

FIGS. 3A and 3B are plan views illustrating RF transistor amplifier packages 370a and 370b including example mold lock structures in accordance with some embodiments of the present disclosure. The packages 370a and 370b are otherwise similar to the package 270 of FIGS. 2A and 2B, with the active transistor dies 210 and the non-RF leads 275 not shown for simplification. The mold locks 202 and 302 are illustrated in combination with rivets 201 that are positioned between pairs of output leads 274, 374, but the configuration of the mold locks 202 and 302 may be independent of the placement of the rivets 201 in some embodiments.

As shown in FIGS. 3A and 3B, the mold locks 202 and 302 are configured to accept portions of the overmold member 278 to secure the RF leads 272, 274 to the flange 276, but may be sized, shaped, positioned, or otherwise configured to reduce and/or minimize electrical impact on operation of the RF transistor amplifier package 370a and 370b. For example, smaller mold locks 202, 302 may reduce current crowding effects in electrical signal transmission of the leads. In the example of FIG. 3A, the input leads 272 and output leads 274 respectively include elliptical- or circular-shaped mold locks 202. The mold locks 202 are positioned inboard of the edges 272e, 274e of the RF leads 272, 274, that is, confined within the width dimension W of the respective external connection tabs 272t, 274t. In the example of FIG. 3B, the input leads 372 and output leads 374 respectively include slot-shaped mold locks 302 that extend in a direction along the respective widths of the leads 372, 374. The mold locks 302 extend towards the edges 372e, 374e of the RF leads 372, 374, that is, beyond the width dimension W of the respective external connection tabs 372t, 374t. While illustrated with two mold locks per lead, it will be understood that fewer or more mold locks per lead may be provided in some embodiments.

FIGS. 4A-4F are plan views illustrating RF transistor amplifier packages 470a-470f including example configurations of rivets 201i and 201o (collectively 201) and isolation structures in accordance with some embodiments of the present disclosure. The packages 470a-470f are otherwise similar to the package 270 of FIGS. 2A and 2B, with some components (e.g., the active transistor dies 210) not shown for simplification. The rivet configurations are illustrated in combination with circular-shaped mold locks 202, but may be independent of the size and/or shapes of the mold locks 202 in some embodiments.

As noted above, in some embodiments the rivets 201 are used to secure an outer frame of a lead frame (which includes the RE leads 272, 274 attached thereto) to the submount or flange 276, with the attachments (e.g., trim bars or tie bars) between the RF leads 272, 274 and the outer frame being subsequently trimmed. That is, the rivets 201 (and lead frame) define components of a fastening mechanism that secures the RF leads 272, 274 to the submount 276 during package fabrication. In some embodiments, the rivets 201 may include remaining portions 201r of the trim bars or tie bars, which may be present after completion of the trimming process. In some embodiments, the rivets 201 may secure an additional lead, such as a ground lead, to the submount 276. As shown in FIGS. 4A-4F, some embodiments of the present disclosure include RF transistor amplifier packages 470a-470f that position one or more rivets 201 between two or more of the package leads 272, 274. For example, in some embodiments, one or two rivets 201 may be positioned between the RF leads of respective amplifier paths P1 and P2, that is, in between adjacent RF input (e.g., gate) leads 272 and/or in between adjacent RF output (e.g., drain) leads 274.

In particular, FIG. 4A illustrates an example package 470a including at least one rivet 201o (and a spacing Sout) between the RF output leads 274 of the adjacent amplifier paths P1 and P2, where the spacing Sout differs from the spacing Sin between the RF input leads 272. However, it will be understood that at least one rivet 201i (and a spacing Sin) may be additionally or alternatively provided between the RF input leads 272 of the adjacent amplifier paths P1 and P2. The rivet(s) 201 (and the associated lead frame) may have dimensions configured to secure the RF leads 272 and/or 274 to the flange 276 and provide mechanical stability during the packaging process. For example, in some embodiments the rivet(s) 201o between multiple RF output leads 274 may have one or more dimensions that are larger than the rivets 201i adjacent each of the RF input leads 272 (or vice versa). Positioning the rivet(s) 201 in-between RF leads of adjacent amplifier paths P1 and P2 may reduce coupling or electromagnetic/RF interference and thus improve electrical isolation therebetween, by providing increased spacing and/or providing an electrical isolation structure between adjacent RF input leads 272, adjacent RF output leads 274, and/or otherwise between adjacent amplifier paths P1, P2.

In some embodiments, positioning the rivet(s) 201 between two or more RF leads 272 or 274 may improve electrical isolation by both increasing the spacing Sin or Sout between the RF leads 272 or 274 and (as the rivets 201 may be electrically connected to the electrically grounded flange 276 in some embodiments) providing a grounded isolation structure between the RF leads 272, 274. FIG. 4B illustrates an example package 470b including an isolation structure 405b in accordance with some embodiments of the present disclosure. As shown in FIG. 4B, the isolation structure 405b may be a conductive structure that is coupled to the rivet 201o positioned between the RF output leads 274 of the adjacent amplifier paths P1 and P2. However, it will be understood that one or more isolation structures 405b may be additionally or alternatively coupled to a rivet 201i positioned between the RF input leads 272 of the adjacent amplifier paths P1 and P2.

In some embodiments, one or more portions of the rivet 201 and/or associated isolation structures 405b may vertically protrude from the flange 276 between the RF leads to define an isolation fence. For example, the isolation structure 405b may include a metal segment (e.g., formed from the same material as the leads, rivets, lead frame, and/or flange) that is bent or otherwise provided in an L-shape 405b (or a U-shape 405b') so as to vertically protrude between adjacent RF leads. In some embodiments, the isolation structure 405b may be a portion of or integral to the rivet 201o. For example the isolation structure 405b may include the remaining portions 201r of the trim bars or tie bars of the rivets(s) 201, which may be bent or otherwise configured to define a portion of the isolation fence. In some embodiments, the isolation structure 405b may be implemented by one or more bond wires that are coupled to one or more of the rivets 201 and/or to the flange 276 between the RF leads 272 and/or 274. More generally, the isolation structure 405b may be configured to reduce coupling or electromagnetic/RF interference between adjacent RF leads 272, 274 and/or amplifier paths P1, P2. Such isolation structures 405b may be advantageous in multi-stage RF power amplifier designs with multiple amplifier paths P1 and P2. For example, the amplifier paths P1 and P2 may define respective RF signal paths of a Class AB dual-path driver amplifier, or may define the main and peaking amplifier paths of a packaged Doherty power amplifier.

In addition, positioning the rivet(s) 201 between two or more adjacent RF leads 272 and/or 274 (and thus, eliminating the rivets in one or more corners C of the flange 276) in accordance with embodiments of the present disclosure may increase the internal usable area within the package for example, for connection and/or configuration of the non-RF leads 275 (also referred to herein as satellite leads). For example, providing the rivet(s) 201o in between the RF output leads 274 provides flexibility for the connection of one or more non-RF leads 275 at peripheral regions (e.g., one or more corners C) of the flange 276 adjacent the RF output leads 274 (and vice versa when the rivet(s) 201i are provided between the RF input leads 272), as well as for desired designs or configurations of the non-RF leads 275. For example, as discussed herein with reference to FIGS. 6A and 6B, the non-RF leads 275 may be configured with larger surface areas, which may reduce or minimize parasitic inductance, and/or rounded or chamfered corners, which may reduce interference with the RF leads 272 and/or 274.

Figure 4C:
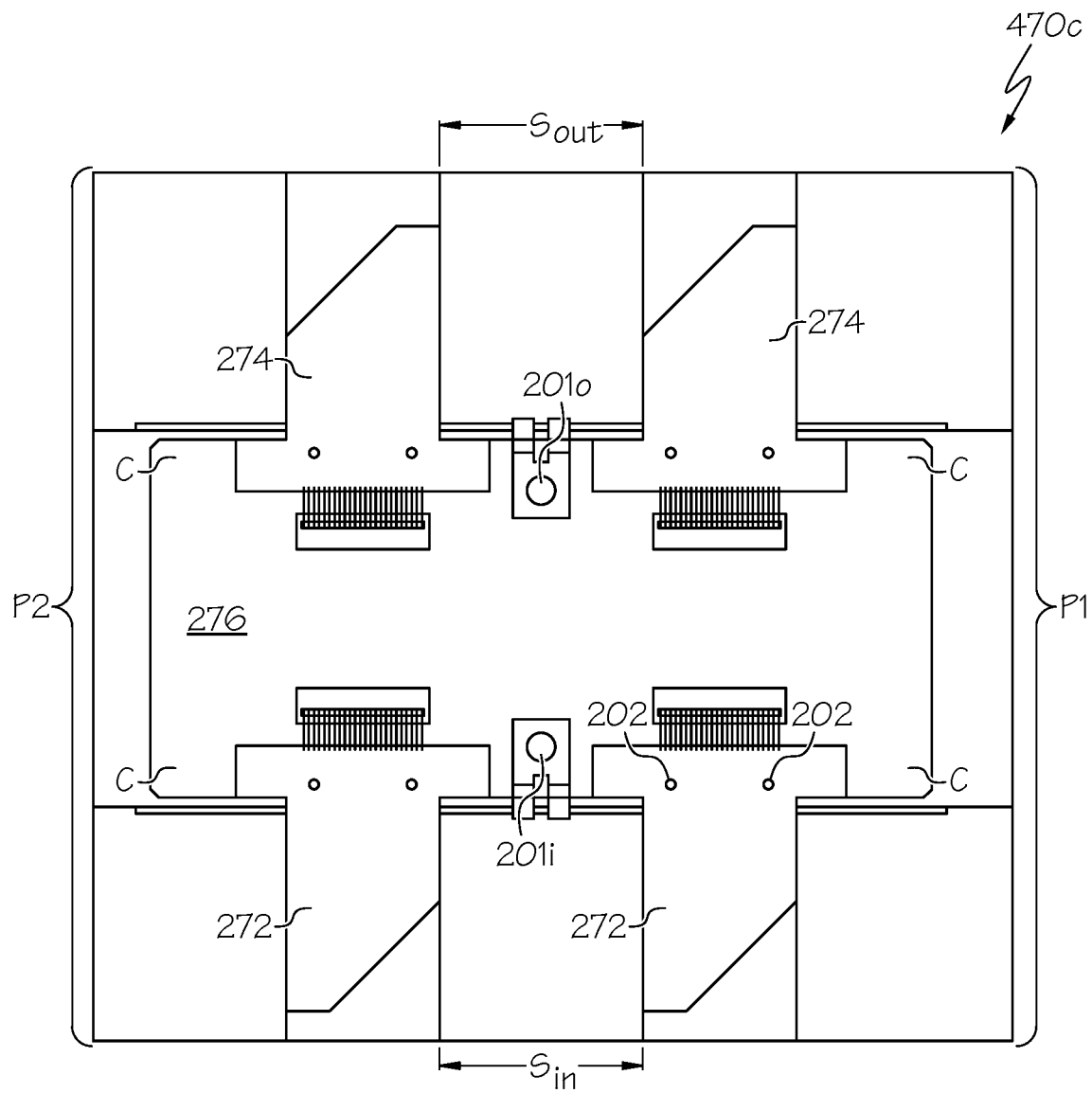

In some embodiments, respective rivets 201 may be attached to the surface of the submount between RF leads of adjacent amplifier paths P1 and P2 on opposing sides of the package. FIG. 4C illustrates an example package 470c including at least one first rivet 201i between RF input (e.g., gate) leads 272 on a first side of the package 470c, and at least one second rivet 201o between RF output (e.g., drain) leads 274 on an opposite or second side of the package 470c. Positioning the rivets 201 away from the corners C may increase the usable area within the dimensions of the submount or flange 276, e.g., for connection and/or configuration of the non-RF leads 275 at both the input (e.g., gate) and the output (e.g., drain) sides of the package 470c. In addition, positioning the rivet(s) 201 between the RF leads 272, 274 increases the spacings Sin/Sout between RF leads 272, 274, thereby improving electrical isolation between amplifier paths P1 and P2 of the package 470c.

In some embodiments, electrical isolation may be improved by both increasing the spacings Sin and Sout between the RF leads 272 and 274, and providing a grounded isolation structure coupled to the rivets 201i and 201o between the RF leads 272 and 274 of the adjacent amplifier paths P1 and P2. FIG. 4D illustrates an example package 470d including an isolation structure 405d in accordance with some embodiments of the present disclosure. As shown in FIG. 4D, the isolation structure 405d may be a conductive structure that extends across the flange 276 and is connected to both the rivet(s) 201o positioned between the RF output leads 274 and the rivet(s) 201i positioned between the RF input leads 272 of the adjacent amplifier paths P1 and P2. For example, the isolation structure 405d may include a metal segment (e.g., formed from the same material as the leads, rivets, and/or flange) that is bent or otherwise provided in an L-shape 405d' (or a U-shape 405d') so as to vertically protrude between adjacent RF leads. In some embodiments, the isolation structure 405d may be or may include a portion of or integral to the rivets 201o and 201i, such as the remaining portion(s) 201r from the trimming process. In some embodiments, the isolation structure 405d may be implemented by one or more bond wires 405d''' connecting the rivets 201i and 201o between the RF leads 272 and 274. More generally, the isolation structure 405d may include one or more vertically-protruding portions that electrically and physically connect the rivets 201i and 201o between the RF leads 272 and 274 to reduce coupling or electromagnetic/RF interference between adjacent amplifier paths P1, P2.

Figure 4E:
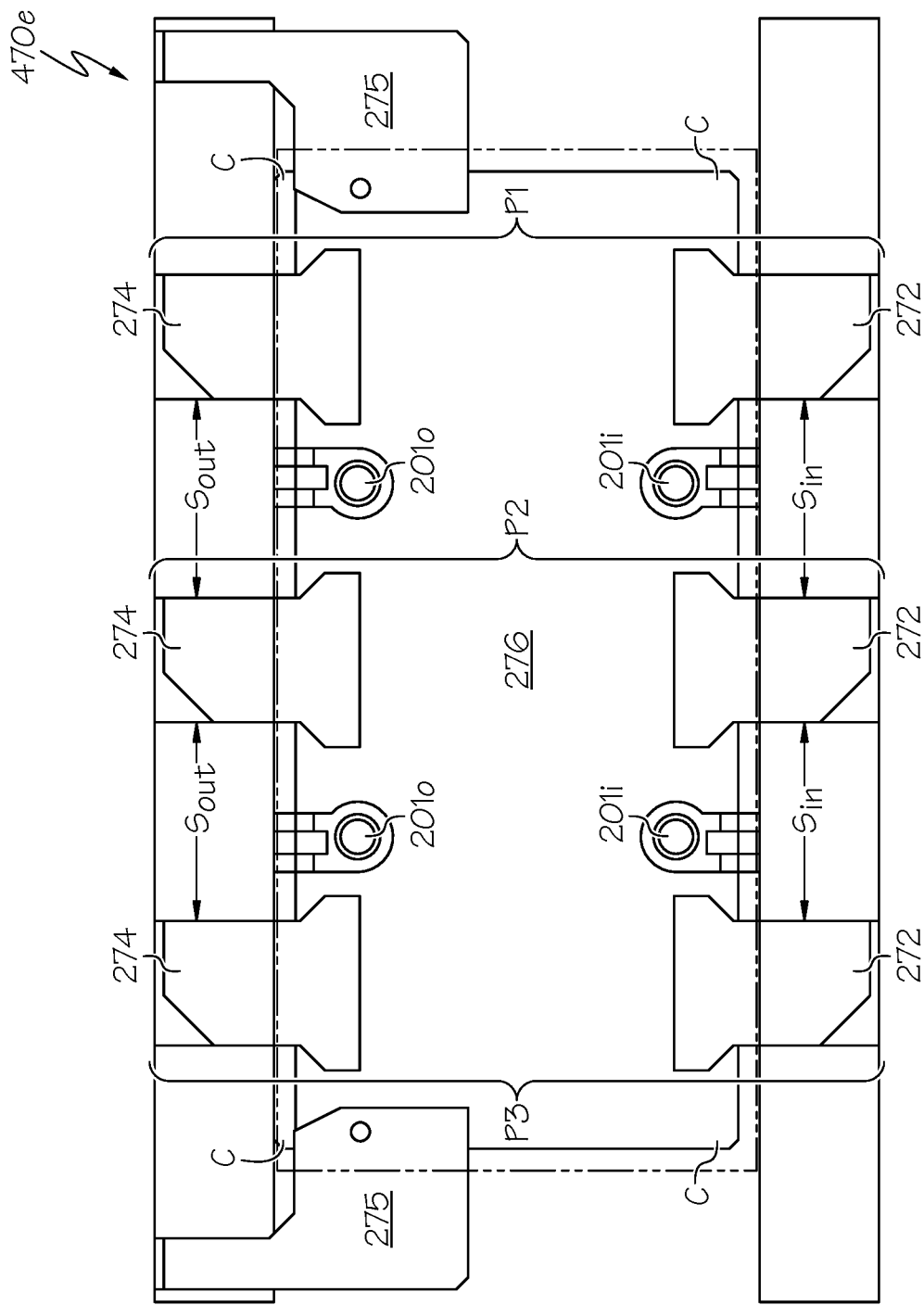
Figure 4F:
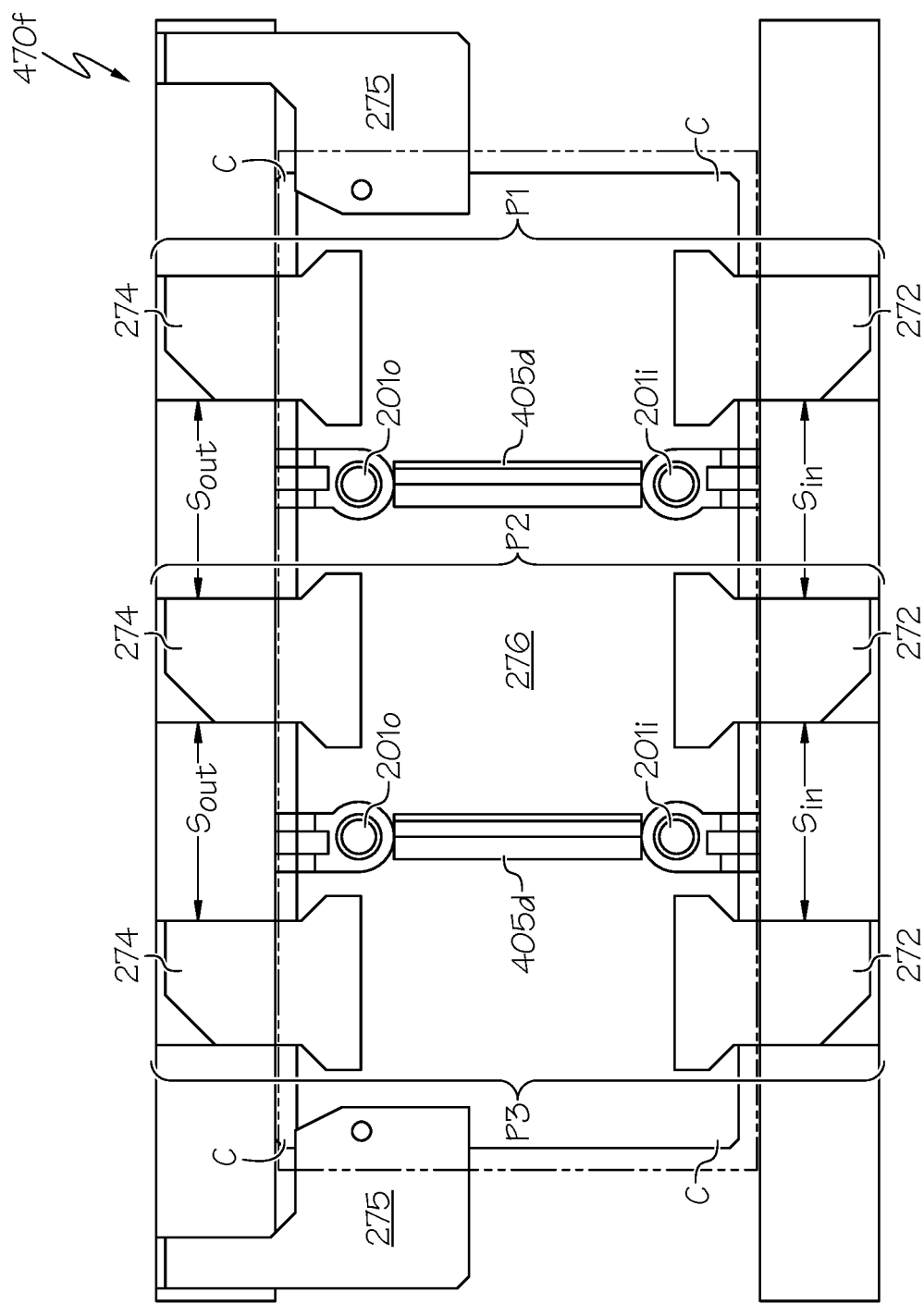

FIGS. 4E and 4F illustrate example packages 470e and 470f, respectively, including electrically conductive RF input (e.g., gate) leads 272 and RF output (e.g., drain) leads 274 that define three side-by-side RF signal paths P1, P2, and P3, with first rivets 201i between RF input leads 272 on a first side of the package 470e, 470f, and second rivets 201o between RF output leads 274 on the opposite or second side of the package 470e, 470f. For example the three RF amplifier paths P1, P2, and P3 may implement a Doherty amplifier configuration with a main amplifier path P1 and first and second peaking amplifier paths P2 and P3. The package 470f of FIG. 4F further includes multiple isolation structures 405d coupled to respective pairs of the first rivets 201i and the second rivets 201o between the RF leads 272 and 274 of the adjacent amplifier paths P1, P2, and P3. The packages 470e and 470f are similar to the packages 470a-470d, and it will be understood that combinations of rivets 201, isolation structures 405, and/or other features described herein with reference to one of the packages 470a-470f may be applied interchangeably with others to provide similar benefits.

Figure 5A:
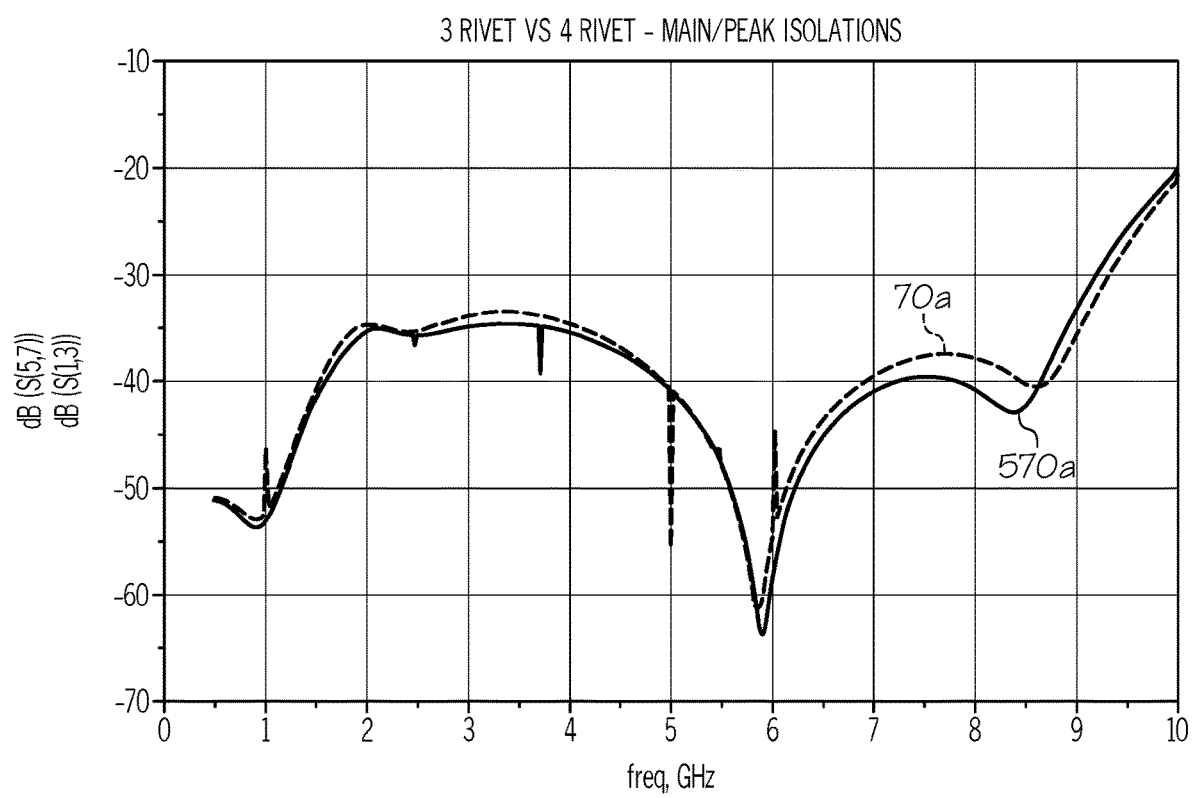
FIGS. 5A, 5B, and 5C are graphs illustrating electrical characteristics of RF transistor amplifier packages including example configurations of mold locks, rivets, and/or isolation structures in accordance with some embodiments of the present disclosure.
Figure 5B:
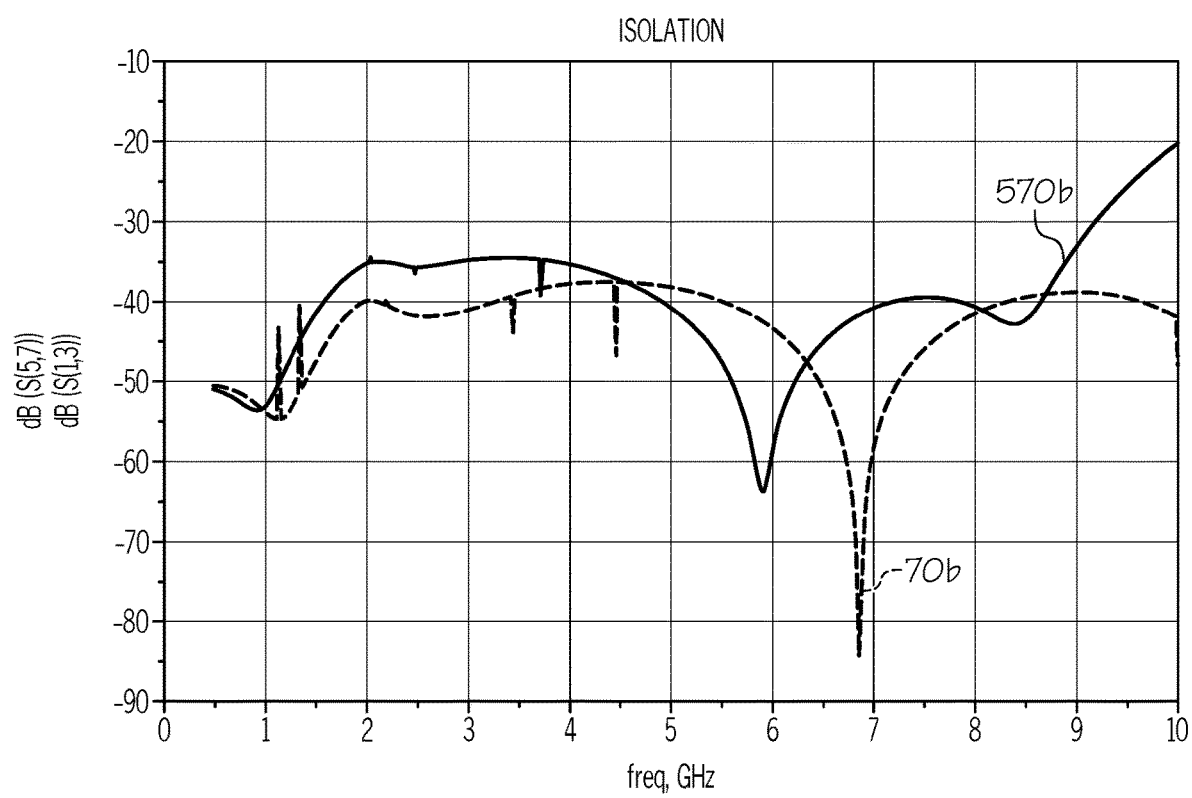
Figure 5C:
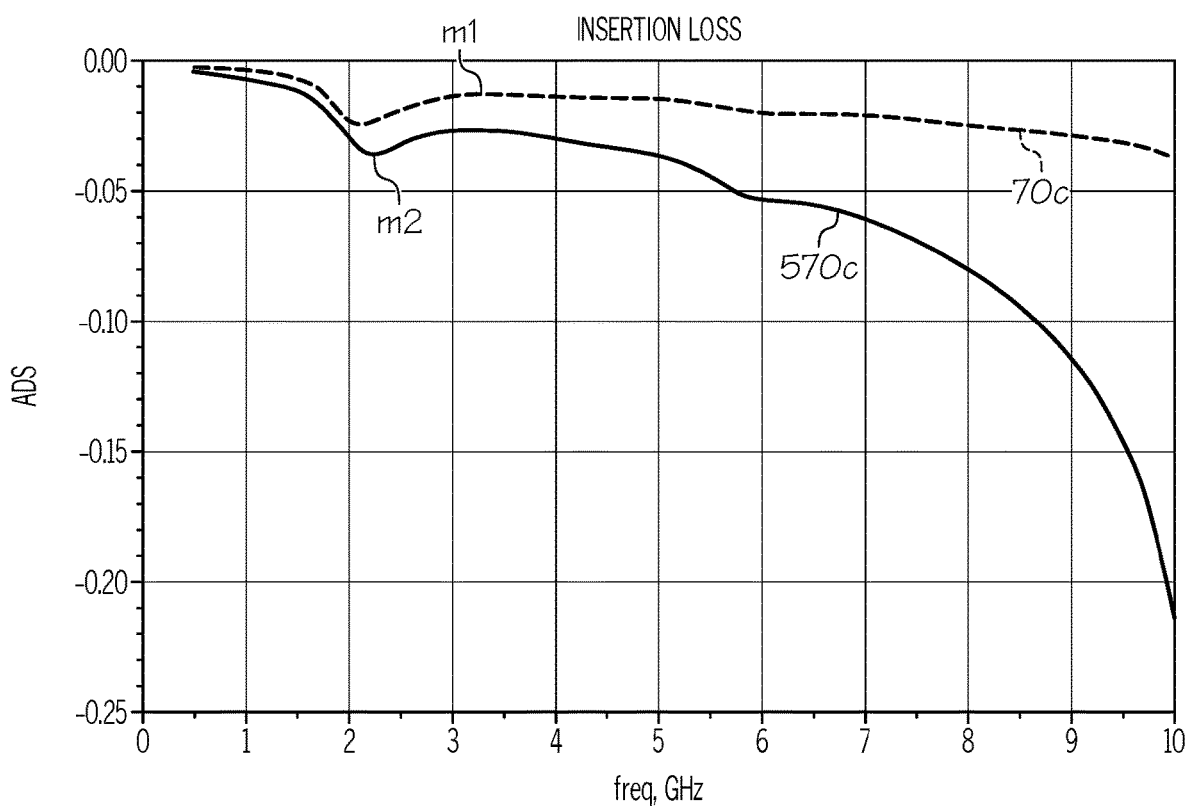

FIGS. 5A, 5B, and 5C are graphs illustrating electrical characteristics of RF transistor amplifier packages including example configurations of mold locks, rivets, and/or isolation structures in accordance with some embodiments of the present disclosure. As shown in FIG. 5A, a package 570a including at least one rivet positioned on a flange between RF leads (rather than at corners of the flange) may provide similar or improved isolation performance over the illustrated frequency range (e.g., up to 10 GHz or more) in comparison to a package 70a including rivets positioned at each corner of the flange, while increasing available space within the internal area of the flange (e.g., for connection and/or configuration of one or more non-RF leads). Likewise, as shown in FIG. 5B, a package 570b including at least one rivet positioned on a flange between RF leads and circular-shaped mold locks may provide similar or improved isolation performance over the illustrated frequency range in comparison to a package 70b including transistor dies in an open cavity enclosed by a ceramic lid. FIG. 5C illustrates insertion loss characteristics of a package 570c including at least one rivet positioned on a flange between RF leads and circular-shaped mold locks in comparison to an open cavity package 70c.

FIGS. 6A and 6B are enlarged plan views of non-RF leads 675a, 675b that may be used in RF transistor amplifier packages according to some embodiments of the present disclosure. For example, the non-RF leads 675a, 675b may correspond to the non-RF leads 275 and/or may be used in the packages 170, 270 described herein.

As shown in FIGS. 6A and 6B, in some embodiments, the non-RF leads 675a, 675b may also be configured to reduce and/or minimize electrical impact on one or more components of the RF transistor amplifier packages described herein. For example, the non-RF leads 675a, 675b may be shaped (e.g., in terms of angle, length, and/or thickness) to reduce and/or minimize parasitic inductance. In some embodiments, the non-RF leads 675a, 675b may be configured with larger surface areas and/or rounded or chamfered corners R. In particular, as shown in FIGS. 6A and 6B, the non-RF leads 675a, 675b include a first portion 675a1, 675b1 that overlaps or extends on the surface of the submount 276, and a second portion 675a2, 675b2 that overhangs or extends beyond (i.e., does not overlap or extend on) the surface of the submount 276. For example, in an overmold package 270 as shown in FIG. 2A, the first portion 675a1, 675b1 may extend within and may be encapsulated by the overmold 278, while the second portion 675a2, 675b2 may extend outside and beyond the overmold 278 to define an external connection tab. A surface area of the second portion 675a2, 675b2 may be greater than or less than that of the first portion 675a1, 675b1.

Increasing the surface area of the non-RF leads 675a, 675b and/or the overlap with the flange 276 may reduce parasitic inductance (e.g., by reducing the equivalent transmission line impedance seen by a termination component outside of the package). The surface area and/or the overlap may be increased in embodiments where the rivets 201 are positioned between the RF leads 272 and/or 274, due to the increase in available surface area at the periphery (e.g., corners C) of the flange 276. As shown in FIGS. 6A and 6B, non-RF leads 675a, 675b may be positioned or otherwise extend from a corner C of the flange 276 that is unobstructed by or free of rivets. The non-RF leads 675a, 675b may be positioned adjacent the RF leads 272 and/or 274, and in some embodiments, corners R of the non-RF leads 675 may be rounded or chamfered e.g., to reduce interference or otherwise increase electrical isolation between the non-RF lead 675 and the RF leads 272, 274. For example, in FIG. 6A, the first portion 675a1 of the non-RF lead 675a extends by a dimension D1 from the corner C along the edge of the flange 276. The corner R of the first portion 675a1 is chamfered to reduce interference with RF signals carried by the adjacent RF leads 272, 274. In the example of FIG. 6A, a dimension D2 of the second portion 675a2 of the non-RF lead 675a is smaller than the dimension D1 of the first portion 675a1.

In FIG. 6B, the first portion 675b1 of the non-RF lead 675b likewise extends by a dimension D1 from the corner C and along the edge of the flange 276, with the corner R chamfered to reduce interference with RF signals carried by the adjacent RF leads. In the example of FIG. 6B, at least one plan view dimension (e.g., D1) of the first portion 675*b*1 is substantially maintained (e.g., D2) in the second portion 675*b*2. That is, in plan view, the first portion 675*b*1 and the second portion 675*b*2 of the non-RF lead 675*b* have at least one common or substantially similar dimension. The surface area of the second portion 675*b*2 may be greater than the surface are of the first portion 675*b*1. The overall surface area of the non-RF lead 675*b* of FIG. 6B is thus greater than that of the non-RF lead 675*a* of FIG. 6A, which may contribute to reduced parasitic inductance. In some embodiments, the first and second portions 675*b*1 and 675*b*2 of the non-RF lead may collectively define a substantially square shape in plan view, and/or may otherwise define a surface area that reduces a parasitic inductance between the first portion 675*a*1/675*b*1 and the flange 276. More generally, the non-RF leads 675*a*, 675*b* may be designed or otherwise configured to reduce inductance based on the available surface area at the periphery of the flange 276, without compromising the surface area for attachment of the dies 210, IPDs 290, 292, and/or other components of the package 270 and while providing sufficient isolation from the RF leads 272, 274.

Figure 7A:
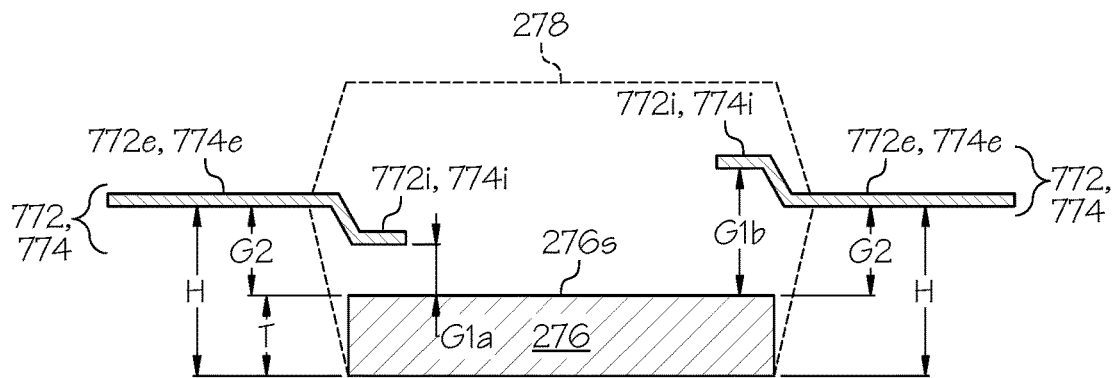
FIG. 7A is a simplified schematic side view illustrating example RF leads that may be used in RF transistor amplifier packages according to some embodiments of the present disclosure.

FIG. 7A is a simplified schematic side view illustrating example leads 772, 774 that may be used in RF transistor amplifier packages according to some embodiments of the present disclosure. The RF leads 772 and 774 may correspond to the input and output RF leads 272 and 274, or even the non-RF leads 275, 675, used in the packages 170, 270 described herein.

Figure 7B:
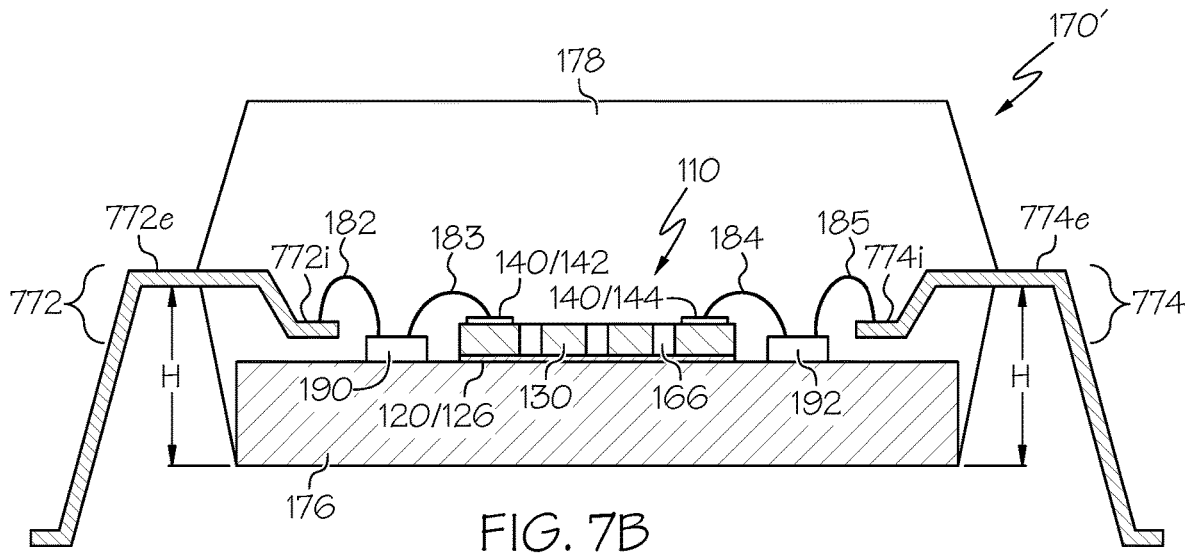
FIGS. 7B and 7C are schematic side views illustrating example RF transistor amplifier packages including the RF leads of FIG. 7A.

As shown in FIGS. 7A and 7B, the leads 772, 774 may be configured to provide a desired electrical impact or transition. For example, the leads 772, 774 may be step-shaped or otherwise configured to provide desired spacings between the leads 772, 774 and the submount or flange 276 (e.g., using one or more recessed or crimped portions) to provide a desired impedance (e.g., for matching circuits and/or to widen video bandwidth) and/or to reduce mutual coupling (e.g., between bond wires). For example, reducing the gap (as shown by G1*a*) of a non-RF lead may reduce the parasitic inductance or equivalent transmission line impedance, which can allow baseband termination capacitors external to or outside of the package to be electrically closer to the active transistor die, which may allow for wider video bandwidth. In some embodiments, the leads 772, 774 may be configured such that portions thereof can be removed, bent, and/or crimped in the same trimming process that is used to separate the leads 772, 774 from the rivets 201 or leadframe, to provide the leads 772, 774 with desired shapes.

In particular, as shown in FIG. 7A, the leads 772 and/or 774 (e.g., input and/or output RF leads) may include first portions 772*i*, 774*i* that overlap the surface 276*s* of the flange 276, and second portions 772*e*, 774*e* that extend beyond the surface 276*s* of the flange 276. The first portions 772*i*, 774*i* and the second portions 772*e*, 774*e* are above a plane defined by or including the surface 276*s* of the flange 276. The first portions 772*i*, 774*i* are separated from the plane of the surface 276*s* by a first spacing or gap G1*a*, G1*b*, and the second portions 772*e*, 774*e* are separated or spaced apart from the plane of the surface 276*s* by a second spacing or gap G2 that is different than the first spacing or gap G1*a*, G1*b*, above and along a direction perpendicular to the surface 276*s* of the flange 276. In some embodiments, the different distances of the gaps G1*a*, G1*b* and G2 may be implemented by bending or crimping the first portions 772*i*, 774*i* of the leads 772, 774 towards or away from the flange 276. Relative to the gap G2, reducing the spacing or gap (shown by smaller gap G1*a*) between the first portions 772*i*, 774*i* of the RF leads 772, 774 and the flange 276 may increase capacitance, while increasing the spacing or gap (shown by larger gap G1*b*) between the first portions 772*i*, 774*i* of the RF leads 772, 774 and the flange 276 may reduce capacitance.

FIG. 7B illustrates implementation of the leads 772, 774 as input and output RF leads in an overmold package 170'. The internal components of the overmold package 170' may be otherwise similar to any of the packages 170, 270 described herein. As shown in FIG. 7B, the first portions 772*i*, 774*i* of the leads 772, 774 are internal to and encapsulated by the overmold member 178, while the second portions 772*e*, 774*e* are extend outside and beyond the overmold 178 to define external connection tabs (e.g., the tabs 272*t*, 274*t*). The internal portions 772*i*, 774*i* of the RF leads 772, 774 may thus each be configured with a respective spacing or gap (e.g., G1*a*, G1*b* of FIG. 7A) from the flange 176 (e.g., to provide a desired impedance for input/output matching circuits, to reduce mutual coupling between bond wires, and/or to widen video bandwidth), while segments of the external portions 772*e*, 774*e* may be maintained at a desired gap (e.g., G2 of FIG. 7A) above a plane of the surface of the flange 276, and/or height H above the lower surface of the package 170' (e.g., a standard seating plane height for an external package connection, such as about 62 mils), for example, to meet customer requirements. The respective spacings or gaps G1*a*, G1*b* may be configured independent of a thickness T of the flange 176, such that a flange 176 having a standard thickness T (e.g., about 50 mils) may be used in the package 170'.

Figure 7C:
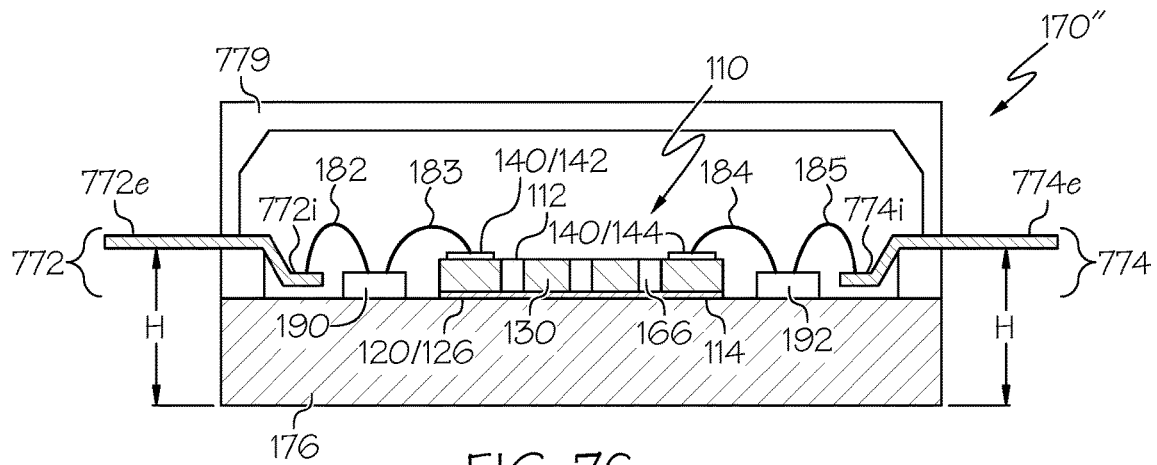

FIG. 7C illustrates implementation of the leads 772, 774 as input and output RF leads in an open cavity package 170". The internal components of the open cavity package 170" may be otherwise similar to any of the packages 170, 270 described herein. The open cavity package 170" includes a lid member 779 (e.g., a ceramic lid) on a submount or flange 176. The lid 779 seals an open-air cavity that includes the RF transistor amplifier die 110 and/or other integrated circuits and associated electrical connections, for example, as shown in FIG. 1A. In the example of FIG. 7C, the leads 772 and 774 are input and output RF leads that provide RF signal connections to the die 110 via the matching circuits 190 and 192, respectively, with desired spacings or gaps (e.g., G1*a*, G1*b* of FIG. 7A) between the flange 176 and the internal portions 772*i*, 774*i* of the RF leads 772, 774 overlapping the flange 176 while maintaining the desired gap (e.g., G2 of FIG. 7A) above a plane of the surface of the flange 176, and/or height H above the lower surface of the package 170". In FIGS. 7A-7C, the respective gaps G1*a*, G1*b* between the internal portions 772*i* and/or 774*i* of the RF leads 772 may be selected or otherwise configured to define respective impedances of at least a portion of an input and/or output matching circuit in a respective RF amplifier path.

Embodiments of the present disclosure may be used in any dual material RF power package in which isolation between two or more RF leads may be desired. For example, embodiments of the present disclosure may be implemented in RF transistor amplifier packages in which a lead material (for example, a lead frame and/or a ground lead) is riveted to a base (such as a heat sink, flange, or die paddle) and protected by an overmold member (such as a plastic overmold).

Referring again to FIG. 1C, a semiconductor structure 130 that may be used in RF transistor amplifier packages described herein, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

In some embodiments of the present invention, the SiC bulk crystal of the substrate 322 may have a resistivity equal to or higher than about $1\times10^5$ ohm-cm at room temperature. Exemplary SiC substrates that may be used in some embodiments of the present invention are manufactured by, for example, Cree, Inc., of Durham, N.C., the assignee of the present invention. Methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although SiC can be used as a substrate material, embodiments of the present application may utilize any suitable substrate. The substrate 322 can be an SiC wafer, and the HEMT device can be formed, at least in part, via wafer-level processing, and the wafer can then be diced to provide a plurality of individual HEMTs.

A channel layer 324 is formed on the upper surface of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial grown of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials.

In some embodiments, the channel layer 324 may be a Group III nitride, such as $Al_xGa_{1-x}N$, where $0 \leq x < 1$, provided that the energy of the conduction band edge of the channel layer 324 is less than the energy of the conduction band edge of the barrier layer 326 at the interface between the channel and barrier layers 324, 326. In certain embodiments of the present invention, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 µm. The channel layer 324 may also be a multi-layer structure, such as a superlattice or combinations of GaN, AlGaN or the like. The channel layer 324 may be under compressive strain in some embodiments.

As discussed above with respect to the conventional HEMT device, a 2DEG layer is induced in the channel layer 324 at a junction between the channel layer 324 and the barrier layer 326. The 2DEG layer acts as a highly conductive layer that allows conduction between the source and drain regions of the device that are beneath the source contact 156 the drain contact 154, respectively. The channel layer 324 and the barrier layer 326 form the semiconductor structure 130.

While semiconductor structure 130 is shown with channel layer 324 and barrier layer 326 for purposes of illustration, semiconductor structure 130 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface of the substrate 322 to provide an appropriate crystal structure transition between the silicon carbide substrate 322 and the remainder of the HEMT device. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

The source contact 156 and the drain contact 154 may be formed on an upper surface of the barrier layer 326 and may be laterally spaced apart from each other. A gate contact 152 may be formed on the upper surface of the barrier layer 326 between the source contact 156 and the drain contact 154. The material of the gate contact 152 may be chosen based on the composition of the barrier layer 326, and may, in some embodiments, be a Schottky contact.

The source contact 156 may be coupled to a reference signal such as, for example, a ground voltage. The coupling to the reference signal may be provided by a via 166 that extends from a lower surface of the substrate 322, through the substrate 322 to an upper surface of the barrier layer 326. The via 166 may expose a bottom surface of the ohmic portion of the source contact 156. A backmetal layer 126 may be formed on the lower surface of the substrate 322 and on sidewalls of the via 166. The backmetal layer 126 may directly contact the ohmic portion of the source contact 156. Thus, the backmetal layer 126, and a signal coupled thereto, may be electrically connected to the source contact 156.

Still referring to FIG. 1C, the HEMT device may include a first insulating layer 350 and a second insulating layer 355. The first insulating layer 350 may directly contact the upper surface of the semiconductor structure 130 (e.g., contact the upper surface of the barrier layer 326). The second insulating layer 355 may be formed on the first insulating layer 350. It will also be appreciated that more than two insulating layers may be included in some embodiments. The first insulating layer 350 and the second insulating layer 355 may serve as passivation layers for the HEMT device.

The source contact 156, the drain contact 154, and the gate contact 152 may be formed in the first insulating layer 350. In some embodiments, at least a portion of the gate contact 152 may be on the first insulating layer. In some embodiments, the gate contact 152 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 154, gate contact 152, and source contact 156.

In some embodiments, field plates 360 may be formed on the second insulating layer 355. At least a portion of a field plate 360 may be on the gate contact 152. At least a portion of the field plate 360 may be on a portion of the second insulating layer 355 that is between the gate contact 152 and the drain contact 154. Field plates and techniques for forming field plates are discussed, by way of example, in U.S. Pat. No. 8,120,064, the disclosure of which is hereby incorporated herein in its entirety by reference.

Metal contacts 365 may be disposed in the second insulating layer 355. The metal contacts 365 may provide interconnection between the drain contact 154, gate contact 152, and source contact 156 and other parts of the HEMT device. Respective ones of the metal contacts 365 may directly contact respective ones of the drain contact 154 and/or source contact 156. The metal contacts 365 may contain metal or other highly conductive material, including, for example, copper, cobalt, gold, and/or a composite metal.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A radio frequency (RF) transistor amplifier package, comprising:
   a submount;
   first and second leads extending from a first side of the submount and configured to provide RF signal connections to one or more transistor dies on a surface of the submount; and
   at least one rivet attached to the surface of the submount between the first and second leads on the first side, wherein the at least one rivet is configured to reduce electromagnetic coupling between the first and second leads.

2. A radio frequency (RF) transistor amplifier package, comprising:
   a submount;
   first and second leads extending from a first side of the submount and configured to provide RF signal connections to one or more transistor dies on a surface of the submount;
   at least one rivet attached to the surface of the submount between the first and second leads on the first side; and
   an isolation structure extending from the at least one rivet on the surface of the submount and configured to reduce electromagnetic coupling between the first and second leads.

3. The RF transistor amplifier package of claim 2, wherein the isolation structure comprises a conductive element vertically protruding from the at least one rivet on the surface of the submount.

4. A radio frequency (RF) transistor amplifier package, comprising:
   a submount;
   first and second leads extending from a first side of the submount and configured to provide RF signal connections to one or more transistor dies on a surface of the submount;
   at least one rivet attached to the surface of the submount between the first and second leads on the first side;
   a first RF amplifier path comprising a first input lead and a first output lead on the surface of the submount; and
   a second RF amplifier path comprising a second input lead and a second output lead on the surface of the submount adjacent the first input lead and the first output lead, respectively,
   wherein the first and second leads comprise the first and second input leads or the first and second output leads, respectively.

5. The RF transistor amplifier package of claim 4, wherein a spacing separating the first and second input leads is different than a spacing separating the first and second output leads.

6. The RF transistor amplifier package of claim 4, wherein the first and second leads comprise the first and second input leads on the first side of the submount, wherein the at least one rivet comprises at least one first rivet, and further comprising:
   at least one second rivet attached to the surface of the submount between the first and second output leads on a second side of the submount opposite the first side.

7. The RF transistor amplifier package of claim 6, further comprising:
   an isolation structure extending between the at least one first rivet and the at least one second rivet on the surface of the submount and configured to reduce electromagnetic coupling between the first and second RF amplifier paths.

8. The RF transistor amplifier package of claim 7, wherein the isolation structure comprises a conductive element vertically protruding from the surface of the submount between the first and second RF amplifier paths and connecting the at least one first rivet to the at least one second rivet.

9. The RF transistor amplifier package of claim 8, wherein the conductive element comprises at least one metal segment and/or at least one bond wire.

10. The RF transistor amplifier package of claim 1, wherein one or more corners of the first side of the submount are free of rivets.

11. The RF transistor amplifier package of claim 10, wherein the first lead and/or the second lead extends to the one or more corners of the first side of the submount.

12. The RF transistor amplifier package of claim 10, further comprising:
    one or more non-RF leads extending from the one or more corners of the first side of the submount.

13. A radio frequency (RF) transistor amplifier package, comprising:
    a submount;
    first and second leads extending from a first side of the submount and configured to provide RF signal connections to one or more transistor dies on a surface of the submount;
    at least one rivet attached to the surface of the submount between the first and second leads on the first side; and
    one or more non-RF leads extending from the one or more corners of the first side of the submount,
    wherein one or more corners of the first side of the submount are free of rivets, and
    wherein the one or more non-RF leads respectively comprise a first portion that extends on the surface of the submount and a second portion that extends beyond the surface of the submount, wherein, in plan view, the first portion and the second portion comprise at least one dimension that is substantially similar.

14. A radio frequency (RF) transistor amplifier package, comprising:
    a submount;
    first and second leads extending from a first side of the submount and configured to provide RF signal connections to one or more transistor dies on a surface of the submount; and
    at least one rivet attached to the surface of the submount between the first and second leads on the first side,
    wherein:
    the first and second leads respectively comprise an internal portion that extends on the surface of the submount and an external portion that extends from the internal portion beyond the surface of the submount; and
    for at least one of the first and second leads, the internal and external portions are separated from a plane of the surface of the submount by different spacings.

15. A radio frequency (RF) transistor amplifier package, comprising:
    a submount;
    first and second leads extending from a first side of the submount and configured to provide RF signal connections to one or more transistor dies on a surface of the submount; and
    at least one rivet attached to the surface of the submount between the first and second leads on the first side,
    wherein the first and second leads comprise respective mold lock features that are configured to accept portions of an overmold member to secure internal portions of the first and second leads to the surface of the submount; and
    wherein the mold lock features comprise elliptical shapes that are confined within a width of external portions of the first and second leads that extend beyond the surface of the submount.

16. The RF transistor amplifier package of claim 1, wherein the one or more transistor dies comprise a gallium nitride-based high electron mobility transistor (HEMT).

17. The RF transistor amplifier package of claim 1, wherein the one or more transistor dies comprise a silicon-based laterally diffused metal oxide semiconductor (LDMOS) transistor.

18. The RF transistor amplifier package of claim 1, wherein the one or more transistor dies are configured to operate in at least a portion of one or more of the 2.5-2.7 GHz, 3.4-4.2 GHz, or 5.1-5.8 GHz frequency bands.

19. The RF transistor amplifier package of claim 1, wherein the one or more transistor dies are configured to operate at frequencies above 10 GHz.

20. A radio frequency (RF) transistor amplifier package, comprising:
a submount;
first and second leads extending from a first side of the submount and configured to provide RF signal connections to one or more transistor dies on a surface of the submount, wherein one or more corners of the first side of the submount are free of rivets; and
one or more non-RF leads extending from the one or more corners of the first side of the submount and respectively comprising a first portion that extends on the surface of the submount and a second portion that extends beyond the surface of the submount, wherein, in plan view, the first portion and the second portion comprise at least one dimension that is substantially similar.

21. The RF transistor amplifier package of claim 20, wherein the first portion and the second portion of the one or more non-RF leads are separated from a plane of the surface of the submount by different first and second spacings thereabove, respectively.

22. A transistor amplifier package, comprising:
a submount; and
at least one lead extending from a first side of the submount and configured to provide a respective signal connection to at least one transistor die on a surface of the submount,
wherein the at least one lead comprises a first portion that extends on the surface of the submount and a second portion that extends from the first portion beyond the surface of the submount, and wherein the first and second portions are separated from a plane of the surface of the submount by different first and second spacings thereabove, respectively.

23. The transistor amplifier package of claim 22, wherein the at least one lead is configured to provide radio frequency (RF) signal connections to the at least one transistor die.

24. The transistor amplifier package of claim 23, wherein the first spacing of the first portion of the at least one lead defines an impedance of at least a portion of an input or output matching circuit for the at least one transistor die, and wherein the second spacing of the second portion of the at least one lead defines a height corresponding to at least one external connection.

25. The transistor amplifier package of claim 22, further comprising:
an overmold member on the surface of the submount,
wherein the first and second portions of the at least one lead extend within and outside the overmold member, respectively.

26. The transistor amplifier package of claim 22, further comprising:
a ceramic lid on the surface of the submount,
wherein the first and second portions of the at least one lead extend within and outside the ceramic lid, respectively.

27. The transistor amplifier package of claim 22, wherein the at least one lead comprises first and second leads configured to provide radio frequency (RF) signal connections to the at least one transistor die, and further comprising:
at least one rivet attached to the surface of the submount between the first and second leads.

28. The transistor amplifier package of claim 27, further comprising:
an isolation structure comprising a conductive element vertically protruding from the at least one rivet on the surface of the submount and configured to reduce electromagnetic coupling between the first and second leads.

29. The transistor amplifier package of claim 23, further comprising:
a first RF amplifier path comprising a first input lead and a first output lead on the surface of the submount; and
a second RF amplifier path comprising a second input lead and a second output lead on the surface of the submount adjacent the first input lead and the first output lead, respectively,
wherein the at least one lead comprises the first and second input leads or the first and second output leads, respectively, and
wherein the different first and second spacings define respective impedances comprising at least a portion of an input or output matching circuit in the first and/or second RF amplifier paths.

30. The transistor amplifier package of claim 22, wherein the at least one transistor die comprises a gallium nitride-based high electron mobility transistor (HEMT).

31. The transistor amplifier package of claim 22, wherein the at least one transistor die comprises a silicon-based laterally diffused metal oxide semiconductor (LDMOS) transistor.

32. The transistor amplifier package of claim 22, wherein the at least one transistor die is configured to operate in at least a portion of one or more of the 2.5-2.7 GHz, 3.4-4.2 GHz, or 5.1-5.8 GHz frequency bands.

33. The transistor amplifier package of claim 22, wherein the at least one transistor die is configured to operate at frequencies above 10 GHz.

34. The RF transistor amplifier package of claim 20, wherein the first lead and/or the second lead extends to the one or more corners of the first side of the submount.

35. The RF transistor amplifier package of claim 20, further comprising:
at least one rivet attached to the surface of the submount between the first and second leads.

36. The RF transistor amplifier package of claim 35, further comprising:
an isolation structure comprising a conductive element vertically protruding from the at least one rivet on the surface of the submount and configured to reduce electromagnetic coupling between the first and second leads.

37. The RF transistor amplifier package of claim 35, further comprising:
a first RF amplifier path comprising a first input lead and a first output lead on the surface of the submount; and
a second RF amplifier path comprising a second input lead and a second output lead on the surface of the submount adjacent the first input lead and the first output lead, respectively, wherein the first and second leads comprise the first and second input leads or the first and second output leads, respectively.

38. The RF transistor amplifier package of claim 20, wherein the one or more transistor dies comprise a gallium nitride-based high electron mobility transistor (HEMT).

39. The RF transistor amplifier package of claim 20, wherein the one or more transistor dies comprise a silicon-based laterally diffused metal oxide semiconductor (LDMOS) transistor.

40. The RF transistor amplifier package of claim 20, wherein the one or more transistor dies are configured to operate in at least a portion of one or more of the 2.5-2.7 GHz, 3.4-4.2 GHz, or 5.1-5.8 GHz frequency bands.

41. The RF transistor amplifier package of claim 20, wherein the one or more transistor dies are configured to operate at frequencies above 10 GHz.

* * * * *

UNITED STATES PATENT AND TRADEMARK OFFICE
CERTIFICATE OF CORRECTION

| | | |
|---|---|---|
| PATENT NO. | : 11,581,859 B2 | Page 1 of 1 |
| APPLICATION NO. | : 16/913783 | |
| DATED | : February 14, 2023 | |
| INVENTOR(S) | : Komposch et al. | |

It is certified that error appears in the above-identified patent and that said Letters Patent is hereby corrected as shown below:

On the Title Page

(71) Applicant: delete "Cree, Inc., Durham, NC (US)" and insert --Wolfspeed Inc., Durham, NC (US)--

Signed and Sealed this
Twenty-third Day of May, 2023

Katherine Kelly Vidal
*Director of the United States Patent and Trademark Office*